(12) United States Patent
Burger, Jr. et al.

(10) Patent No.: US 9,378,835 B2
(45) Date of Patent: Jun. 28, 2016

(54) METHODS AND APPARATUS FOR SOFT DATA GENERATION FOR MEMORY DEVICES BASED USING REFERENCE CELLS

(75) Inventors: Harley F. Burger, Jr., San Jose, CA (US); Erich F. Haratsch, San Jose, CA (US); Milos Ivkovic, Sunnyvale, CA (US); Victor Krachkovsky, Allentown, PA (US); Nenad Miladinovic, Campbell, CA (US); Andrei Vityaev, San Jose, CA (US); Johnson Yen, Fremont, CA (US)

(73) Assignee: Seagate Technology LLC, Cupertino, CA (US)

( * ) Notice: Subject to any disclaimer, the term of this patent is extended or adjusted under 35 U.S.C. 154(b) by 288 days.

(21) Appl. No.: 13/063,895

(22) PCT Filed: Sep. 30, 2009

(86) PCT No.: PCT/US2009/059081
§ 371 (c)(1),
(2), (4) Date: May 31, 2011

(87) PCT Pub. No.: WO2010/039869
PCT Pub. Date: Apr. 8, 2010

(65) Prior Publication Data
US 2011/0225350 A1    Sep. 15, 2011

Related U.S. Application Data

(63) Continuation-in-part of application No. PCT/US2009/049333, filed on Jun. 30, 2009, now Pat. No. 8,788,923.

(60) Provisional application No. 61/194,751, filed on Sep. 30, 2008.

(30) Foreign Application Priority Data

Jun. 30, 2009   (WO) ................ PCT/US2009/049333

(51) Int. Cl.
| | | |
|---|---|---|
| G11C 11/409 | (2006.01) | |
| G11C 11/16 | (2006.01) | |
| G06F 12/02 | (2006.01) | |
| G11C 16/26 | (2006.01) | |
| G11C 7/02 | (2006.01) | |
| G11C 7/04 | (2006.01) | |
| G11C 11/56 | (2006.01) | |

(Continued)

(52) U.S. Cl.
CPC ............ G11C 16/26 (2013.01); G06F 12/0246 (2013.01); G11C 7/02 (2013.01);
(Continued)

(58) Field of Classification Search
CPC .... G06F 12/02; G11C 11/409; G11C 11/413; G11C 11/419; G11C 11/16
See application file for complete search history.

(56) References Cited

U.S. PATENT DOCUMENTS 7,643,342 B2 * 1/2010 Litsyn et al. ............. 365/185.09
7,730,384 B2 * 6/2010 Graef et al. .................. 714/780
(Continued)

FOREIGN PATENT DOCUMENTS

JP        2006114078          4/2006
WO    WO 2008/042593 A1    4/2008
(Continued)

*Primary Examiner* — Yong Choe
*Assistant Examiner* — Mohamed Gebril
(74) *Attorney, Agent, or Firm* — Ryan, Mason & Lewis, LLP

(57) ABSTRACT

Methods and apparatus are provided for soft data generation for memory devices using reference cells. At least one soft data value is generated in a memory device by writing a known data to one or more reference cells; reading one or more of the reference cells; obtaining a read statistic based on the read one or more reference cells; and obtaining the at least one soft data value based on the obtained read statistic. The read statistics can optionally be obtained for one or more desired locations of a memory array; or for a given pattern, PATT, in one or more aggressor cells. The read statistic can optionally comprise asymmetric statistics obtained for a plurality of possible values.

37 Claims, 36 Drawing Sheets

(51) Int. Cl.
   *G11C 16/04* (2006.01)
   *G11C 16/34* (2006.01)
   *G06F 11/10* (2006.01)

(52) U.S. Cl.
   CPC ............. *G11C 7/04* (2013.01); *G11C 11/5642* (2013.01); *G11C 16/0483* (2013.01); *G11C 16/3418* (2013.01); *G06F 11/1068* (2013.01); *G06F 2212/1032* (2013.01); *G06F 2212/2022* (2013.01); *G11C 2211/5634* (2013.01)

(56) References Cited

U.S. PATENT DOCUMENTS

| | | | |
|---|---|---|---|
| 7,975,192 B2 * | 7/2011 | Sommer et al. | 714/719 |
| 2006/0015802 A1 | 1/2006 | Hocevar | |
| 2008/0123420 A1 * | 5/2008 | Brandman | G06F 11/1072 365/185.09 |
| 2008/0151617 A1 | 6/2008 | Alrod et al. | |
| 2008/0162791 A1 * | 7/2008 | Eldredge | G11C 11/56 711/103 |
| 2009/0067237 A1 | 3/2009 | Lee | |
| 2009/0241008 A1 | 9/2009 | Kim et al. | |
| 2009/0241009 A1 | 9/2009 | Kong et al. | |
| 2009/0310406 A1 | 12/2009 | Sarin et al. | |
| 2011/0145681 A1 | 6/2011 | Yang | |
| 2012/0163085 A1 | 6/2012 | Alrod et al. | |
| 2014/0059406 A1 | 2/2014 | Hyun et al. | |
| 2015/0058536 A1 | 2/2015 | Seol et al. | |

FOREIGN PATENT DOCUMENTS

| | | |
|---|---|---|
| WO | WO 2008053472 | 5/2008 |
| WO | WO2008057822 | 5/2008 |

* cited by examiner

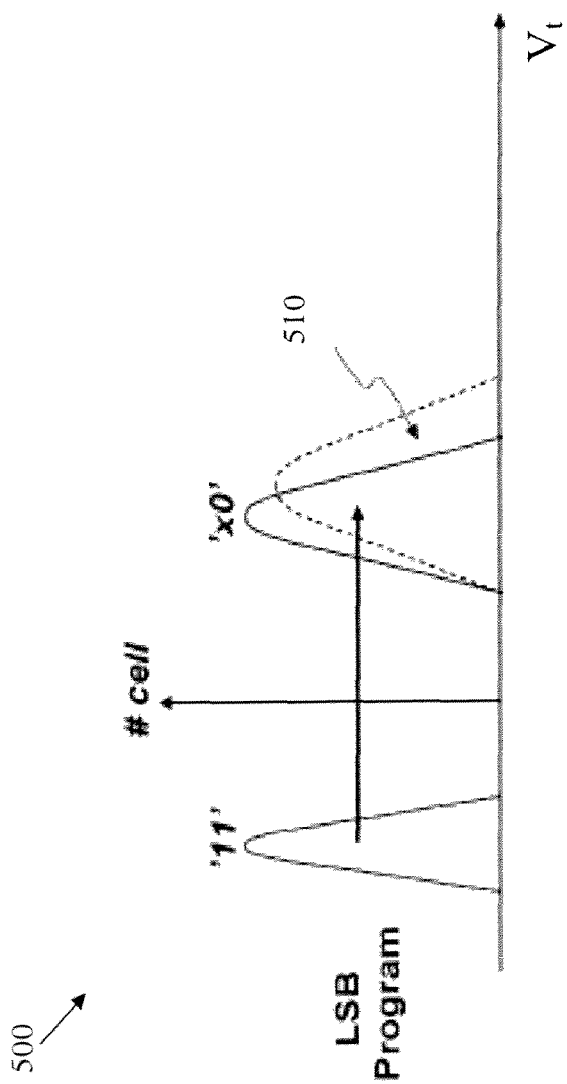
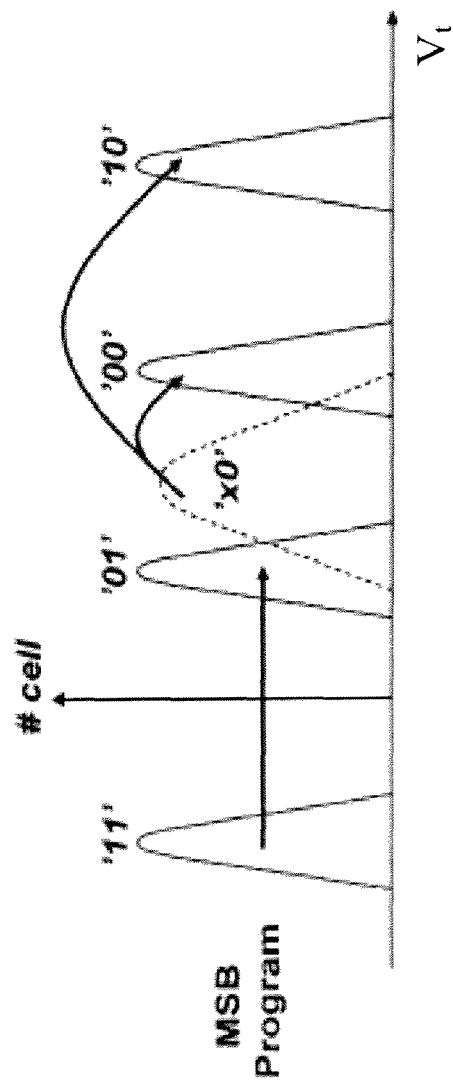
FIG. 5A
FIG. 5B

Cell-Based Statistics Count Table 1700

| Written (s) / Read (s) | 00 | 01 | 10 | 11 | sum |
|---|---|---|---|---|---|
| 00 | 10617 | 148 | 2 | 1 | 10768 |
| 01 | 0 | 10480 | 0 | 14 | 10494 |
| 10 | 15 | 5 | 10610 | 4 | 10634 |
| 11 | 0 | 7 | 0 | 10603 | 10610 |
| sum | 10632 | 10640 | 10612 | 10622 | |

FIG. 17A

Cell-Based Statistics Table for $p(s \mid \hat{s})$ 1720

| Written ($s$) / Read ($\hat{s}$) | 00 | 01 | 10 | 11 |
|---|---|---|---|---|
| 00 | 0.98598 | 0.01374 | 1.86E-04 | 9.29E-05 |
| 00 | 0 | 0.99866 | 0 | 1.334E-3 |
| 10 | 1.41E-3 | 4.7E-4 | 0.9977 | 3.76E-4 |
| 11 | 0 | 6.6E-4 | 0 | 0.9993 |

FIG. 17B

Cell-Based Statistics Table for $p(\hat{s} \mid s)$ 1740

| Written ($s$) / Read ($\hat{s}$) | 00 | 01 | 10 | 11 |
|---|---|---|---|---|
| 00 | 0.9986 | 1.39E-2 | 1.88E-4 | 9.41E-5 |
| 01 | 0 | 0.9850 | 0 | 1.32E-3 |
| 10 | 1.41E-3 | 4.70E-4 | 0.9998 | 3.76E-4 |
| 11 | 0 | 6.58E-4 | 0 | 0.9982 |

FIG. 17C

Pattern-Dependent Cell-Based Statistics Table $p(\hat{s}, \bar{h} \mid s)$ 1800

| Written ($s$) <br> Read ($\hat{s}$), Pattern ($\bar{h}$) | 00 | 01 | 10 | 11 |
|---|---|---|---|---|
| 00,00 | 0.24 | 1E-2 | 0 | 0 |
| 00,01 | 0.3 | 1E-2 | 0 | 0 |
| 00,10 | 0.25 | 5E-2 | 0 | 0 |
| 00,11 | 0.2 | 3E-2 | 1E-3 | 0 |
| 01,00 | 0 | 0.3 | 0 | 2E-2 |
| 01,01 | 0 | 0.2 | 9E-3 | 1E-2 |
| 01,10 | 0 | 0.1 | 0 | 2E-2 |
| 01,11 | 0 | 0.2 | 0 | 5E-2 |
| 10,00 | 1E-3 | 0 | 0.4 | 4E-3 |
| 10,01 | 2E-3 | 0 | 0.3 | 3E-3 |
| 10,10 | 3E-3 | 0 | 0.2 | 1E-3 |
| 10,11 | 4E-3 | 1E-1 | 9E-2 | 2E-3 |
| 11,00 | 0 | 0 | 0 | 0.25 |
| 11,01 | 0 | 0 | 0 | 0.25 |
| 11,10 | 0 | 0 | 0 | 0.3 |
| 11,11 | 0 | 0 | 0 | 0.09 |

FIG. 18

METHODS AND APPARATUS FOR SOFT DATA GENERATION FOR MEMORY DEVICES BASED USING REFERENCE CELLS

CROSS-REFERENCE TO RELATED APPLICATIONS

The present application claims priority to U.S. Provisional Patent Application Ser. No. 61/194,751, filed Sep. 30, 2008, (now U.S. Pat. No. 8,830,748), and International Patent Application Serial No. PCT/US09/49333, filed Jun. 30, 2009, entitled "Methods and Apparatus for Soft Demapping and Intercell Interference Mitigation in Flash Memories," (now U.S. Pat. No. 8,788,923), each incorporated by reference herein.

The present application is related to International Patent Application entitled "Methods and Apparatus for Soft Data Generation for Memory Devices Based on Performance Factor Adjustment," International Patent Application entitled "Methods and Apparatus for Soft Data Generation for Memory Devices," and International Patent Application entitled "Methods and Apparatus for Soft Data Generation for Memory Devices Using Decoder Performance Feedback," each filed simultaneously herewith and incorporated by reference herein.

FIELD OF THE INVENTION

The present invention relates generally to flash memory devices and more particularly, to improved soft demapping and soft data generation techniques for mitigating the effect of intercell interference, back pattern dependency, noise and other distortions in such flash memory devices.

BACKGROUND OF THE INVENTION

A number of memory devices, such as flash memory devices, use analog memory cells to store data. Each memory cell stores an analog value, also referred to as a storage value, such as an electrical charge or voltage. The storage value represents the information stored in the cell. In flash memory devices, for example, each analog memory cell typically stores a certain voltage. The range of possible analog values for each cell is typically divided into threshold regions, with each region corresponding to one or more data bit values. Data is written to an analog memory cell by writing a nominal analog value that corresponds to the desired one or more bits.

Single-level cell (SLC) flash memory devices, for example, store one bit per memory cell (or two possible memory states). Multi-level cell (MLC) flash memory devices, on the other hand, store two or more bits per memory cell (i.e., each cell has four or more programmable states). For a more detailed discussion of MLC flash memory devices, see, for example, International Patent Application Serial No. PCT/US09/36810, filed Mar. 11, 2009, entitled "Methods and Apparatus for Storing Data in a Multi-Level Cell Flash Memory Device with Cross-Page Sectors, Multi-Page Coding and Per-Page Coding," incorporated by reference herein.

In multi-level NAND flash memory devices, for example, floating gate devices are employed with programmable threshold voltages in a range that is divided into multiple intervals with each interval corresponding to a different multibit value. To program a given multibit value into a memory cell, the threshold voltage of the floating gate device in the memory cell is programmed into the threshold voltage interval that corresponds to the value.

The analog values stored in memory cells are often distorted. The distortions are typically due to, for example, back pattern dependency (BPD), noise and intercell interference (ICI). For a more detailed discussion of distortion in flash memory devices, see, for example, J. D. Lee et al., "Effects of Floating-Gate Interference on NAND Flash Memory Cell Operation," IEEE Electron Device Letters, 264-266 (May 2002) or Ki-Tae Park, et al., "A Zeroing Cell-to-Cell Interference Page Architecture With Temporary LSB Storing and Parallel MSB Program Scheme for MLC NAND Flash Memories," IEEE J. of Solid State Circuits, Vol. 43, No. 4, 919-928, (April 2008), each incorporated by reference herein.

A number of techniques have been proposed or suggested for mitigating the effect of ICI and other disturbances. For example, Ki-Tae Park, et al. describe existing programming techniques, such as even/odd programming, bottom up programming and multi-stage programming that mitigate ICI. International Patent Application Serial No. PCT/US09/49333, filed Jun. 30, 2009, entitled "Methods and Apparatus for Soft Demapping and Intercell Interference Mitigation in Flash Memories," discloses methods and apparatus for soft demapping and disturbance mitigation in flash memories.

While these existing methods have helped to improve the decoding performance of flash memories, they suffer from a number of limitations, which if overcome, could further improve the reliability of flash memories. For example, current flash memories typically only provide hard data to the flash control system for decoding. It is well known, however, that soft data can improve error rate performance in the decoding process. Thus, a need exists for soft data generation techniques that use hard data from the flash memory to estimate or enhance the soft data and thereby improve the decoding performance.

SUMMARY OF THE INVENTION

Generally, methods and apparatus are provided for soft data generation for memory devices using reference cells. According to one aspect of the invention, at least one soft data value is generated in a memory device by writing known data to one or more reference cells; reading one or more of the reference cells; obtaining a read statistic based on the read one or more reference cells; and obtaining the at least one soft data value based on the obtained read statistic. The known data can be written to the reference cells using one or more of voltages, currents, and resistances. Likewise, the reading step reads one or more of data bits, voltage levels, current levels and resistance levels. The known data may comprise a bit pattern or a symbol pattern. The generated soft data value may comprise (i) a soft read value that is used to generate one or more log likelihood ratios; or (ii) one or more log likelihood ratios. The statistics can comprise one or more of bit-based statistics, cell-based and pattern-dependent statistics.

In one embodiment, the read statistic is determined by comparing one or more bits read from the one or more reference cells to one or more bits in the known data. For example, the read statistic can be based on a number of erroneous bits relative to a total number of reference bits in the known data. The read statistic or the soft data value (or both) can be computed as a function of one or more of endurance, number of program/erase cycles, number of read cycles, retention time, temperature, temperature changes, process corner, inter-cell interference impact, location within the memory device, location within a wordline, location within a memory array, and pattern in aggressor cells.

According to one aspect, the read statistic can be obtained for one or more desired locations of a memory array, and wherein the writing step comprises writing the known data to the one or more desired locations. For example, the desired locations can comprise one or more of a page location, a wordline location, a bitline location and a given bit within a multi-level cell.

According to another aspect, the read statistic can be obtained for a given pattern, PATT, in one or more aggressor cells associated with at least one target cell; and wherein the writing step comprises writing the known data to the at least one target cell; and wherein the method further comprises the steps of determining a number of erroneous target bits having the given pattern, PATT, in the one or more aggressor cells; and obtaining the read statistic for the given pattern based on the number of erroneous target bits.

According to yet another aspect, the read statistic can comprise asymmetric read statistics obtained for a plurality of possible values; and wherein the method further comprises the steps of determining a number of erroneous bits having a first value in the known data; determining the number of erroneous bits having a second value in the known data; obtaining a read statistic for the first value based on the number of erroneous bits having the first value; and obtaining a read statistic for the second value based on the number of erroneous bits having the second value.

A more complete understanding of the present invention, as well as further features and advantages of the present invention, will be obtained by reference to the following detailed description and drawings.

BRIEF DESCRIPTION OF THE DRAWINGS

FIGS. 5A and 5B, collectively, illustrate an alternative MLC programming scheme that reduces the ICI inflicted on neighboring cells;

FIGS. 17A through 17C are exemplary cell-based statistics tables that record statistics for reading out data from the flash memory;

FIG. 18 is an exemplary pattern-dependent cell-based statistics table that records pattern-dependent statistics for reading out data from the flash memory;

DETAILED DESCRIPTION

Various aspects of the present invention are directed to soft data generation techniques for improved decoding in memory devices, such as single-level cell or multi-level cell (MLC) NAND flash memory devices. As used herein, a multi-level cell flash memory comprises a memory where each memory cell stores two or more bits. Typically, the multiple bits stored in one flash cell belong to different pages. While the invention is illustrated herein using memory cells that store an analog value as a voltage, the present invention can be employed with any storage mechanism for memory devices, such as the use of voltages or currents to represent stored data, as would be apparent to a person of ordinary skill in the art.

Figure 1:
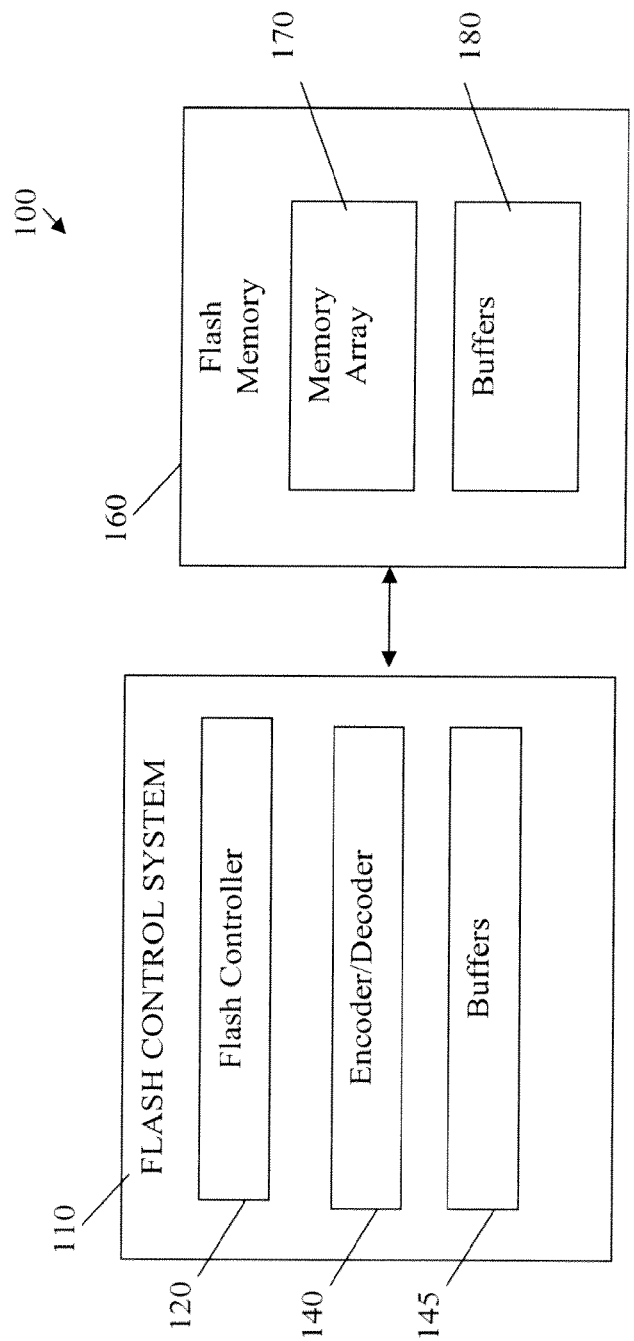
FIG. 1 is a schematic block diagram of a conventional flash memory system.

FIG. 1 is a schematic block diagram of a conventional flash memory system 100. As shown in FIG. 1, the exemplary flash memory system 100 comprises a flash control system 110 and a flash memory block 160. The exemplary flash control system 110 comprises a flash controller 120, an encoder/decoder block 140 and one or more buffers 145. In an alternative embodiment, the encoder/decoder block 140 and some buffers 145 may be implemented inside the flash controller 120. The encoder/decoder block 140 and buffers 145 may be implemented, for example, using well-known commercially available techniques and/or products.

The exemplary flash memory block 160 comprises a memory array 170 and one or more buffers 180 that may each be implemented using well-known commercially available techniques and/or products. The memory array 170 may be embodied as a single-level or multi-level cell flash memory, such as a NAND flash memory, a phase-change memory (PCM), an MRAM memory, a NOR flash memory or another non-volatile flash memory. While the invention is illustrated primarily in the context of a multi-level cell NAND flash memory, the present invention can be applied to single-level cell flash memories and other non-volatile memories as well, as would be apparent to a person of ordinary skill in the art.

Multi-Level Cell Flash Memory

Figure 2:
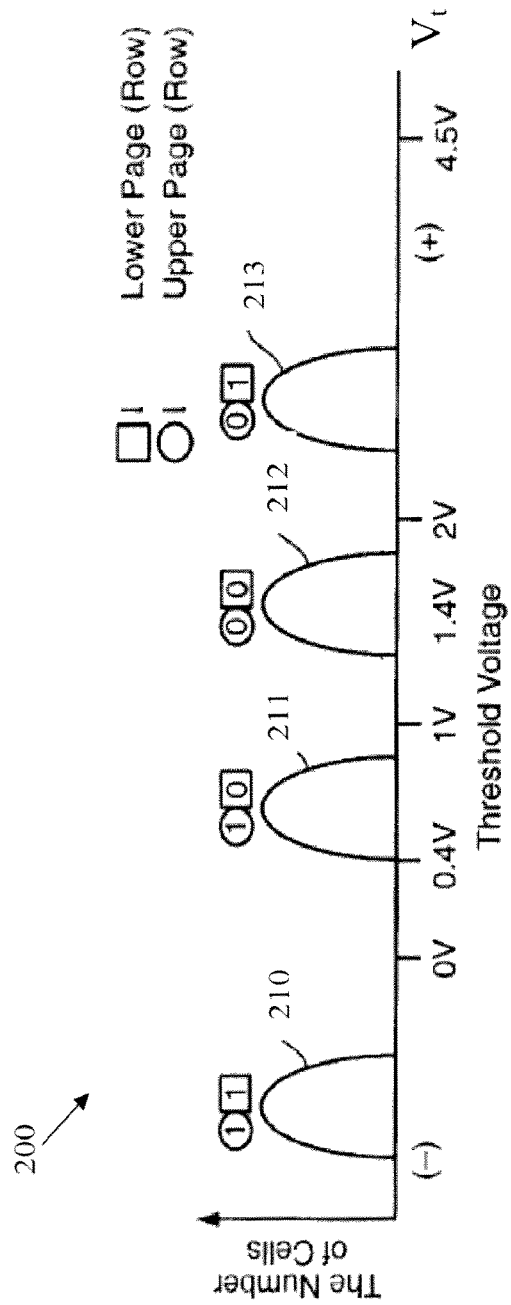
FIG. 2 illustrates an exemplary threshold voltage distribution for the exemplary flash memory of FIG. 1.

In a multi-level cell NAND flash memory, a threshold detector is typically employed to translate the voltage value associated with a particular cell to a predefined memory state. FIG. 2 illustrates an exemplary threshold voltage distribution for the exemplary multi-level cell flash memory 160 of FIG. 1, based on the teachings of U.S. Pat. No. 6,522,580, incorporated by reference herein. Generally, the threshold voltage of a cell is the voltage that needs to be applied to the cell so that the cell conducts a certain amount of current. The threshold voltage is a measure for the data stored in a cell.

In the exemplary embodiment shown in FIG. 2, each storage element employs four possible data states to store two bits of data in each memory cell. FIG. 2 illustrates four peaks 210-213, with each peak corresponding to one state. In a multi-level cell flash device, the different peaks 210-213 of the threshold voltage distribution graph 200 are used for storing two bits in the cell.

The peaks 210-213 of the threshold voltage distribution graph 200 are labeled with corresponding binary values. Thus, when a cell is in a first state 210, it represents a "1" for the lower bit (also known as least significant bit, LSB) and a "1" for the upper bit (also known as most significant bit, MSB). State 210 is generally the initial unprogrammed or erased state of the cell. Likewise, when a cell is in the second state 211, it represents a "0" for the lower bit and a "1" for the upper bit. When a cell is in the third state 212, it represents a "0" for the lower bit and a "0" for the upper bit. Finally, when a cell is in the fourth state 213, it represents a "1" for the lower bit and a "0" for the upper bit.

Threshold voltage distribution 210 represents a distribution of the threshold voltages $V_t$ of the cells within the array that are in an erased state ("11" data state), with negative threshold voltage levels below 0 volts. Threshold voltage distributions 211 and 212 of memory cells storing "10" and "00" user data, respectively, are shown to be between 0 and 1 volts and between 1 and 2 volts, respectively. Threshold voltage distribution 213 shows the distribution of cells that have been programmed to the "01" data state, with a threshold voltage level set between 2 and 4.5 volts of the read pass voltage.

Thus, in the exemplary embodiment of FIG. 2, 0 volts, 1 volt and 2 volts can be used as voltage level thresholds between each level or state. The voltage level thresholds are used by the flash memory 160 (e.g., sensing circuits in the flash memory 160) to determine the voltage level or state of a given cell. The flash memory 160 will assign one or more bits to each cell based on a comparison of the measured voltages to the voltage level thresholds, which are then transmitted as hard decisions to the flash control system 110. In addition or alternatively, in an implementation using soft information, the flash memory 160 may transmit the measured voltages or a quantized version of the measured voltages to the flash control system 110 as soft information, where a larger number of bits is used to represent the measured voltage than the number of bits stored in the memory cell.

It is further noted that cells are typically programmed using well-known Program/Verify techniques. Generally, during a Program/Verify cycle, the flash memory 160 gradually applies an increasing voltage to store a charge in the cell transistor until a minimum target threshold voltage is exceeded. For example, when programming a '10' data state in the example of FIG. 2, the flash memory 160 may gradually apply an increasing voltage to store a charge in the cell transistor until a minimum target threshold voltage of 0.4V is exceeded.

As discussed further below, each of the two bits stored in a single memory cell is from a different page. In other words, each bit of the two bits stored in each memory cell carries a different page address. The right side bit shown in FIG. 2 is accessed when a lower page address is input. The left side bit is accessed when an upper page address is input.

Figure 3:
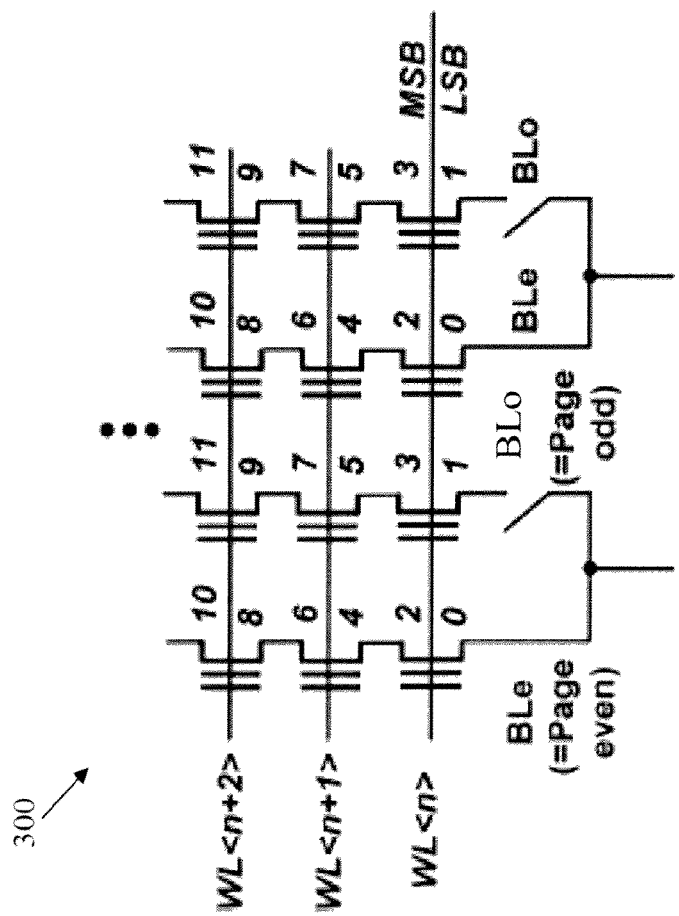
FIG. 3 illustrates the architecture of an exemplary flash cell array in a multi-level cell (MLC) flash memory device.

FIG. 3 illustrates the architecture of an exemplary flash cell array 300 in a multi-level cell (MLC) flash memory device 160, where each exemplary cell typically corresponds to a floating-gate transistor that stores two bits. In FIG. 3 each cell is associated with two numbers for the two pages to which the two bits belong. The exemplary cell array section 300 shows wordlines n through n+2 and four bitlines. The exemplary flash cell array 300 is partitioned into even and odd pages, where for example cells with even numbers (such as the cell with the numbers 0 and 2) correspond to even pages, and cells with odd numbers (such as the cell with the numbers 1 and 3) correspond to odd pages. Wordline n stores, for example, even pages 0 and 2 in the even bitlines, and odd pages 1 and 3 in the odd bit lines.

In addition, FIG. 3 indicates an exemplary program sequence, where either an even or odd bitline cell is selected and programmed sequentially (bottom up) in the indicated order. The numbers indicate the order in which the pages are programmed. For example, page 0 is programmed before page 1. For a further discussion of the programming of even and odd pages, see for example K.T. Park et al., "A Zeroing Cell-to-Cell Interference Page Architecture with Temporary LSB Storing and Parallel MSB Program Scheme for MLC NAND Flash Memories," IEEE Journal of Solid-State Circuits, Vol. 43, No. 4, 919-928 (April 2008), incorporated by reference herein.

Figure 4:
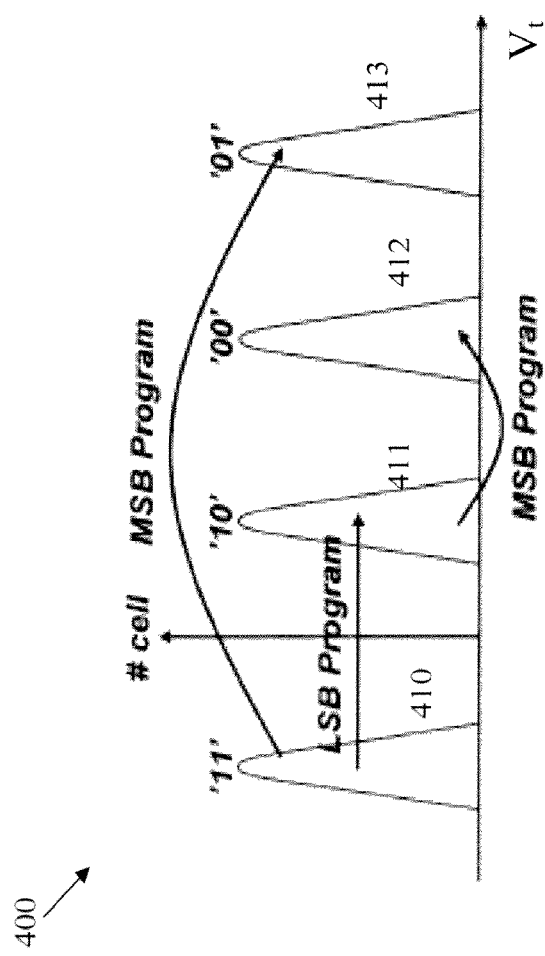
FIG. 4 illustrates an exemplary two-stage MLC programming scheme for the voltage assignment scheme of FIG. 2.

FIG. 4 illustrates an exemplary two-stage MLC programming scheme 400 for the voltage assignment scheme of FIG. 2. As shown in FIG. 4, during an LSB program stage, the states of selected cells that are in an erased state 410 move to the lowest programmed state 411 if the LSB is zero. Thus, at the LSB programming stage, a memory cell is programmed from the erased state '11' to '10'. Next, during the MSB program stage, two states, state '00' (412) and state '01' (413) are formed sequentially, depending on the previous LSB data. Generally, during the MSB programming stage, the '10' state is programmed to '00', and the state '11' is programmed to '01'.

It is noted that the programming scheme 400 of FIG. 4 illustrates a maximum voltage shift associated with the change in state from state 410 to state 413. A number of programming schemes have been proposed or suggested to reduce the maximum voltage shift associated with a change in state, and thereby reduce the ICI caused by voltage shifts.

FIGS. 5A and 5B, collectively, illustrate an alternative MLC programming scheme 500 that reduces the ICI inflicted on neighboring cells. As shown in FIG. 5A, during the LSB programming stage, a memory cell is programmed from a state '11' to a state 'x0' as a temporary (or intermediate) state, in a similar manner to SLC programming. After the neighbor cells in the same wordline are also LSB programmed, the distribution is possibly widened as shown by peak 510 in FIG. 5A, due to ICI. Thereafter, at the MSB programming stage, shown in FIG. 5B, the 'x0' state is programmed to either '00' and '10' as the final state corresponding to the input data or else the '11' state is programmed to the final '01' state. Generally, all memory cells except '11' cells are reprogrammed to their final states at the MSB programming stage from the temporary programmed state for LSB data so that the ICI caused by neighbor cells can be largely reduced. A cell in the final state will not suffer from ICI it experienced while being in the intermediate state since it has been reprogrammed to the final state. A cell in the final state will only suffer from ICI it experienced since being in the final state. As noted above, the multi-step programming sequence of FIGS. 5A and 5B, using intermediate program states, reduces the maximum voltage changes and therefore the ICI caused by these voltage changes. It can been seen in FIG. 5B that the maximum voltage shifts, for example, during the MSB programming stage, are associated with transitions from state '11' to '01' and state 'x0' to state '10' respectively. These voltage shifts are significantly smaller than the maximum voltage shift from state '11' to '01' in FIG. 4.

Figure 6:
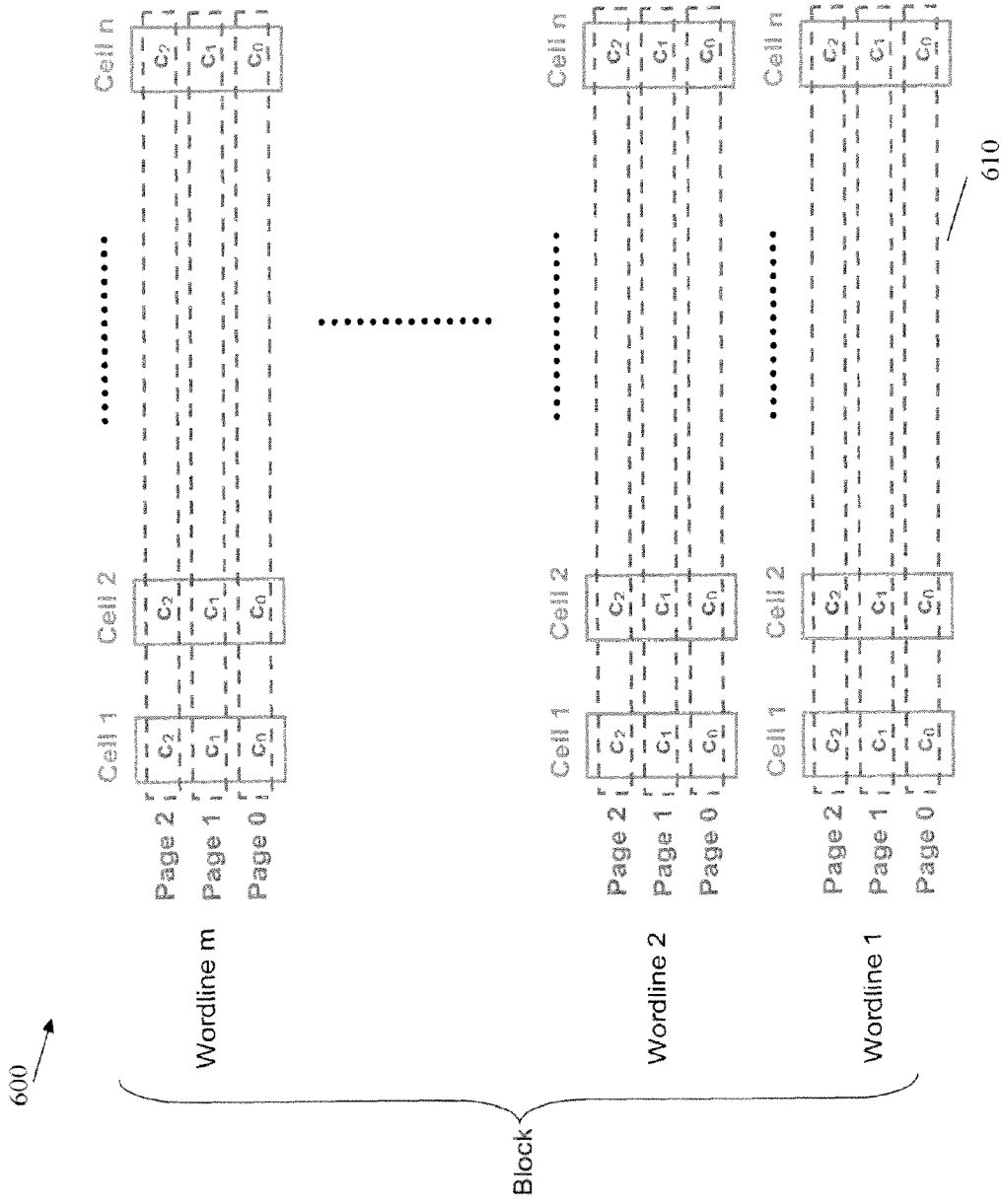
FIG. 6 illustrates an exemplary flash cell array in a multi-level cell (MLC) flash memory device in further detail.

FIG. 6 illustrates an exemplary flash cell array 600 in a multi-level cell (MLC) flash memory device 130 in further detail. As shown in FIG. 6, the flash cell array 600 stores three bits per flash cell, $c_j$. FIG. 6 illustrates the flash cell array architecture for one block, where each exemplary cell typically corresponds to a floating-gate transistor that stores three bits. The exemplary cell array 600 consists of m wordlines and n bitlines. Typically, in current multi-page cell flash memories the bits within a single cell belong to different pages. In the example of FIG. 6, the three bits for each cell correspond to three different pages, and each wordline stores three pages. In the following discussion, pages 0, 1, and 2 are referred to as the lower, middle, and upper page levels within a wordline.

As indicated above, a flash cell array can be further partitioned into even and odd pages, where, for example, cells with even numbers (such as cells 2 and 4 in FIG. 6) correspond to even pages, and cells with odd numbers (such as cells 1 and 3 in FIG. 6) correspond to odd pages. In this case, a page (such as page 0) would contain an even page (even page 0) in even cells and an odd page (odd page 0) in odd cells.

Intercell Interference and Other Disturbances

Figure 7:
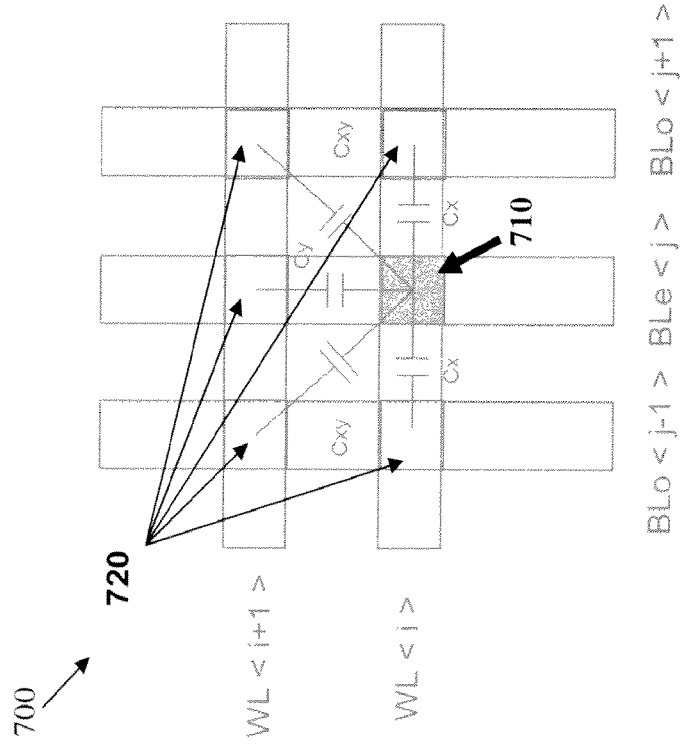
FIG. 7 illustrates the disturbances that are present for a target cell due to a number of exemplary aggressor cells, such as intercell interference, back pattern dependency, noise and other distortions.

FIG. 7 illustrates the disturbances that are present for a target cell 710 due to a number of exemplary aggressor cells 720, such as intercell interference, back pattern dependency, noise and other distortions. The following notations are employed in FIG. 7:
WL: wordline;
BL: bitline;
BLo: odd bitline;
BLe: even bitline; and
C: capacitance.

ICI, for example, is caused by aggressor cells 720 that are programmed after the target cell 710 has been programmed. The ICI changes the voltage, $V_t$, of the target cell 710. In the exemplary embodiment, a "bottom up" programming scheme is assumed and adjacent aggressor cells in wordlines i and i+1 cause ICI for the target cell 710. With such bottom-up programming of a block, ICI from the lower wordline i−1 is removed, and up to five neighboring cells contribute to ICI as aggressor cells 720, as shown in FIG. 7. It is noted, however, that the techniques disclosed herein can be generalized to cases where aggressor cells from other wordlines, such as wordline i−1, contribute to ICI as well, as would be apparent to a person of ordinary skill in the art. If aggressor cells from wordlines i−1, i and i+1 contribute to ICI, up to eight closest neighboring cells need to be considered. Other cells that are further away from the target cell can be neglected, if their contribution to ICI is negligible. In general, the aggressor cells 720 are identified by analyzing the programming sequence scheme (such as bottom up or even/odd techniques) to identify the aggressor cells 720 that are programmed after a given target cell 710.

Generally, $V_t$ is the voltage representing the data stored on a cell and obtained during a read operation. $V_t$ can be obtained by a read operation, for example, as a soft voltage value with more precision than the number of bits stored per cell, or as a value quantized to a hard voltage level with the same resolution as the number of bits stored per cell (e.g., 3 bits for 3 bits/cell flash).

For a more detailed discussion of ICI mitigation techniques, see, for example, International Patent Application Serial No. PCT/US09/49326, entitled "Methods and Apparatus for Read-Side Intercell Interference Mitigation in Flash Memories;" (now U.S. Pat. No. 8,462,549), or International Patent Application Serial No. PCT/US09/49327, entitled "Methods and Apparatus for Write-Side Intercell Interference Mitigation in Flash Memories," (now U.S. Pat. No. 8,526,230), each incorporated by reference herein.

Soft Data Generation

The present invention provides soft demapping and soft data generation techniques for flash memories. In one exemplary embodiment, discussed further below in conjunction with FIG. 12A, enhanced soft data is generated from the soft data assigned by the flash memory using probability statistics, such as probability density functions, approximations thereof, bit-based probabilities, or cell-based probabilities. In another exemplary embodiment, discussed further below in conjunction with FIG. 12B, the soft data is generated from the hard data assigned by the flash memory using probability statistics, such as probability density functions, approximations thereof, bit based-probabilities or cell-based probabilities. Generally, the data that is assigned by the flash memory is initially obtained. The present invention then generates or enhances the soft information, such as probability or reliability information, based on the data from the flash memory. The generated soft information can optionally be used for soft decision decoding. As used herein, the term "probability density functions" shall include probability density functions and approximations thereof, such as histograms and Gaussian approximations.

Figure 8:
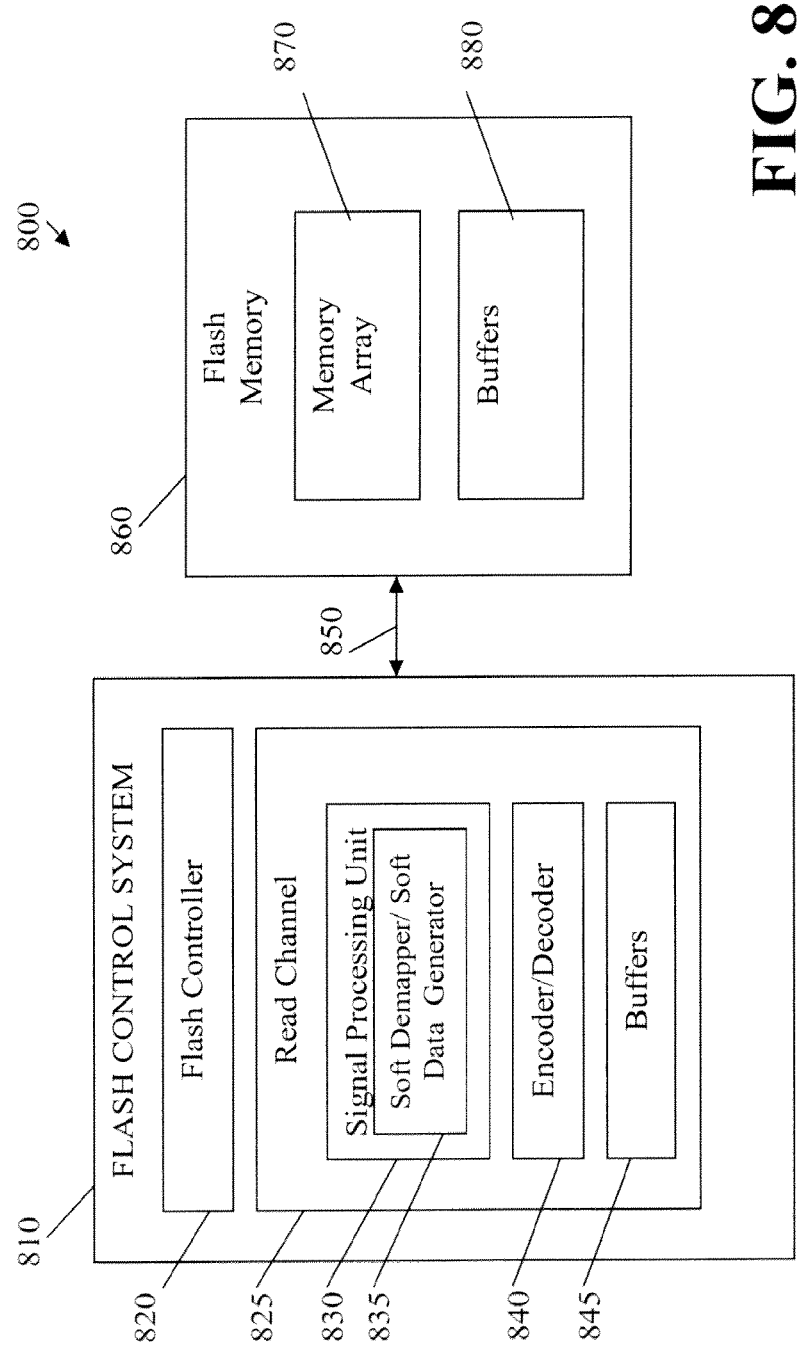
FIG. 8 is a schematic block diagram of an exemplary flash memory system incorporating controller-based soft demapping/soft data generation techniques in accordance with the present invention.

FIG. 8 is a schematic block diagram of an exemplary flash memory system 800 incorporating controller-based soft data generation techniques in accordance with the present invention. As shown in FIG. 8, the exemplary flash memory system 800 comprises a flash control system 810 and a flash memory block 860, connected by an interface 850. The exemplary flash control system 810 comprises a flash controller 820 and a read channel 825, typically on one or more integrated circuits.

The exemplary read channel 825 comprises a signal processing unit 830, an encoder/decoder block 840 and one or more buffers 845. It is noted that the term "read channel" can encompass the write channel as well. In an alternative embodiment, the encoder/decoder block 840 and some buffers 845 may be implemented inside the flash controller 820. The encoder/decoder block 840 and buffers 845 may be implemented, for example, using well-known commercially available techniques and/or products, as modified herein to provide the features and functions of the present invention.

The exemplary signal processing unit 830 comprises one or more processors that implement one or more soft demapper and/or soft data generation processes 835, discussed further below in conjunction with, for example, FIGS. 12A and 12B, respectively. The exemplary flash memory block 860 comprises a memory array 870 and one or more buffers 880 that may each be implemented using well-known commercially available techniques and/or products.

In various embodiments of the disclosed soft data generation techniques, the exemplary interface 850 may need to convey additional information relative to a conventional flash memory system, such as values representing information associated with aggressor cells. Thus, the interface 850 may need to have a higher capacity or faster rate than an interface in conventional flash memory systems. The interface 850 may optionally be implemented, for example, in accordance with the teachings of International PCT Patent Application Serial No. PCT/US09/49328, entitled "Methods and Apparatus for Interfacing Between a Flash Memory Controller and a Flash Memory Array", (now U.S. Pat. No. 8,677,056), and incorporated by reference herein, which increases the information-carrying capacity of the interface 850 using, for example, Double Data Rate (DDR) techniques. During a write operation, the interface 850 transfers the program values to be stored in the target cells, typically using page or wordline level access techniques. For a more detailed discussion of exemplary page or wordline level access techniques, see, for example, International Patent Application Serial No. PCT/US09/36810, filed Mar. 11, 2009, entitled "Methods and Apparatus for Storing Data in a Multi-Level Cell Flash Memory Device with Cross-Page Sectors, Multi-Page Coding and Per-Page Coding," (now U.S. Pat. No. 8,724,381), incorporated by reference herein.

During a read operation, the interface 850 transfers hard and/or soft read values that have been obtained from the memory array 870 for target and aggressor cells. For example, in addition to read values for the page with the target cell, read values for one or more adjacent pages in upper/lower wordlines or neighboring even or odd bit lines are transferred over the interface bus. In the embodiment of FIG. 8, the disclosed soft data generation techniques are implemented outside the flash memory, typically in a process technology optimized for logic circuits to achieve the lowest area. It is at the expense, however, of the additional aggressor cell data that may be transferred on the interface 850.

Figure 9:
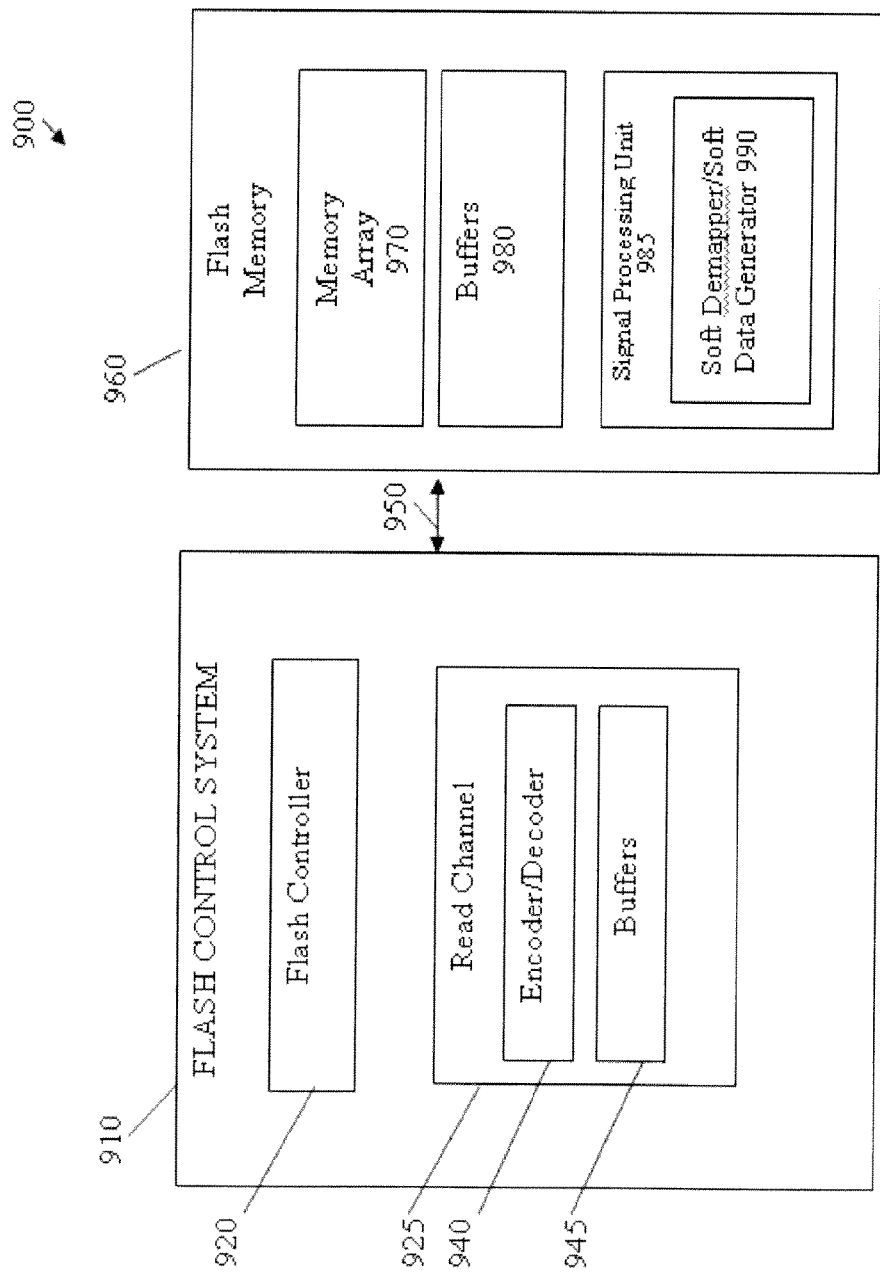
FIG. 9 is a schematic block diagram of an exemplary flash memory system incorporating memory-based soft demapping/soft data generation techniques in accordance with an alternate embodiment of the present invention.

FIG. 9 is a schematic block diagram of an exemplary flash memory system 900 incorporating memory-based soft data generation techniques in accordance with an alternate embodiment of the present invention. As shown in FIG. 9, the exemplary flash memory system 900 comprises a flash control system 910 and a flash memory block 960, connected by an interface 950.

The exemplary flash control system 910 comprises a flash controller 920 and an optional read channel 925, typically on one or more integrated circuits. In an alternative embodiment, the encoder/decoder block 940 and some buffers 945 may be implemented inside the flash controller 920. The exemplary flash controller 920 may be implemented, for example, using well-known commercially available techniques and/or products, as modified herein to support the features and functions of the present invention. The exemplary read channel 925 comprises an encoder/decoder block 940 and one or more buffers 945. The encoder/decoder block 940 and buffers 945 may be implemented using well-known commercially available techniques and/or products.

The exemplary flash memory block 960 comprises a memory array 970 and one or more buffers 980 that may each be implemented using well-known commercially available techniques and/or products. In addition, the exemplary flash memory block 960 comprises an exemplary signal processing unit 985 that comprises one or more processors that implement one or more soft demapping and/or soft data generation processes 990, discussed further below in conjunction with, for example, FIGS. 12A and 12B, respectively.

In various embodiments of the disclosed soft data generation techniques, the exemplary interface 950 may need to convey additional information relative to a conventional flash memory system, such as values representing information associated with aggressor cells. Thus, the interface 950 may need to have a higher capacity or faster rate than an interface in conventional flash memory systems. The interface 950 may optionally be implemented, for example, in accordance with the teachings of International PCT Patent Application Serial No. PCT/US09/49328, entitled "Methods and Apparatus for Interfacing Between a Flash Memory Controller and a Flash Memory Array", (now U.S. Pat. No. 8,677,056), and incorporated by reference herein, which increases the information-carrying capacity of the interface 950 using, for example, Double Data Rate (DDR) techniques.

During a write operation, the interface 950 transfers the program data to be stored in the target and aggressor cells. During a read operation, the interface 950 transfers the new hard or soft read values or data for the target cell(s) and optionally the aggressor cells. Typically, the information conveyed for a single read access is a page or wordline of data. It is noted that only sending data for the target cells reduces the bandwidth requirements of the interface 950, at the expense of implementing the soft data generation processes inside the memory using the memory process technology used to manufacture the flash memory, which is typically optimized for memory and not logic circuits.

Figure 10:
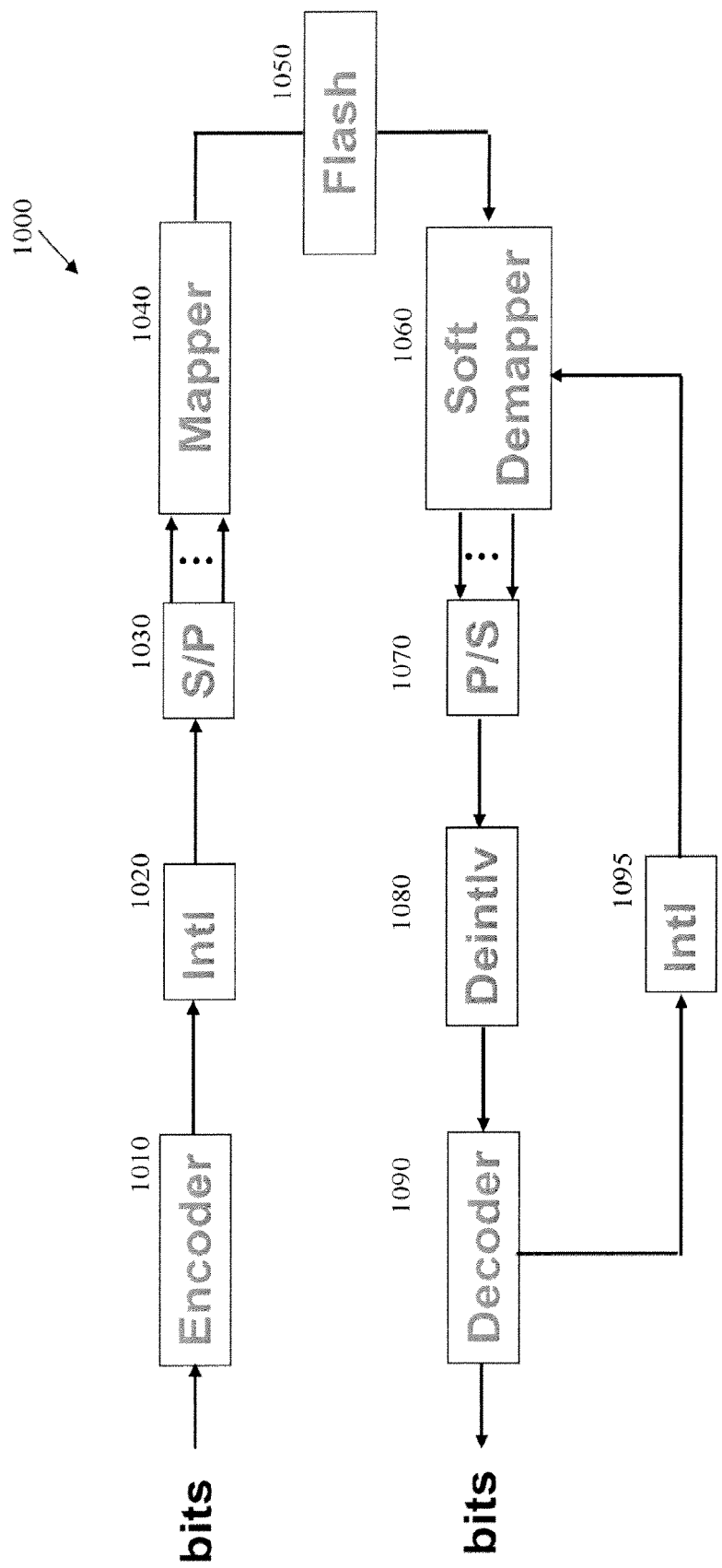
FIG. 10 illustrates an exemplary flash read channel architecture with iterative demapping and decoding, and optional interleaving.

FIG. 10 illustrates an exemplary flash read channel architecture 1000 with iterative demapping and decoding in accordance with the teachings of International Patent Application Serial No. PCT/US09/49333, filed Jun. 30, 2009, entitled "Methods and Apparatus for Soft Demapping and Intercell Interference Mitigation in Flash Memories," (now U.S. Pat. No. 8,788,923), incorporated by reference herein, and optional interleaving. As shown in FIG. 10, the exemplary write path comprises an encoder 1010, an optional interleaver 1020, a serial-to-parallel converter 1030 and a mapper 1040. Data is written to and read from the memory 1050, in a known manner. The exemplary read path comprises a soft demapper or soft data generator 1060, a parallel-to-serial converter 1070, a deinterleaver 1080, a decoder 1090 and an interleaver 1095. Generally, as discussed further below, the soft demapper or soft data generator 1060 generates soft information as described further below that is processed by the decoder 1090 to generate new soft information and fed back to the soft demapper in an iterative manner, until the iterative process converges to a final decision.

The equations employed by the soft demapper 1060 to generate the soft information (LLRs) in accordance with the present invention are discussed below in the section entitled "Computation of Soft Data (LLRs) Using Read Statistics." As shown in FIG. 10, the soft information generated by the demapper 1060 can be used for iterative demapping and decoding between the soft demapper 1060, deinterleaver 1080, decoder 1090, and an interleaver 1095 in the feedback path.

Soft Data Generation Based on Data from Flash

The present invention recognizes that current flash memories 860, 960 typically only provide hard data to the flash control system 810, 910. It is well known, however, that soft data can improve error rate performance in the decoding process. Thus, according to one aspect of the invention, hard data from the flash memory 860, 960 is used to estimate soft data and thereby improve the decoding performance in the flash control system 810, 910. For example, as discussed hereinafter, statistical properties of the hard data can be used to estimate or enhance the soft data. The generated soft data can then be used for decoding, such as belief propagation decoding of LDPC codes, to improve error rate performance.

According to another aspect of the invention, the flash memory 860, 960 provides soft data or soft information to the flash control system 810, 910. Enhanced soft data is generated from the soft data provided by the flash memory 860, 960 to thereby improve the decoding performance in the flash control system 810, 910. In an implementation using soft information, the flash memory system 860, 960 transmits the measured voltages or a quantized version of the measured voltages to the flash control system 810, 910 as soft information, where a larger number of bits is used to represent the measured voltage than the number of bits stored in the memory cell.

Figure 11:
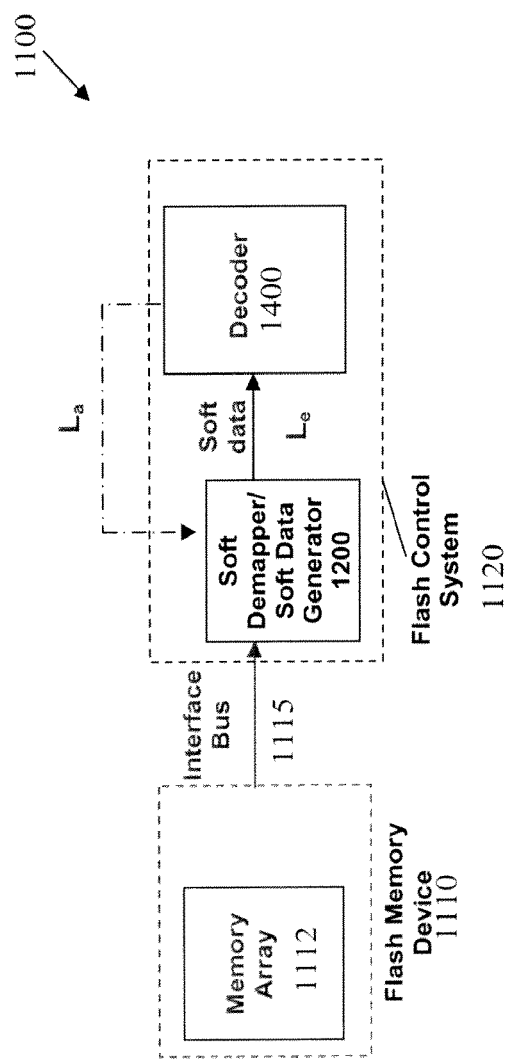
FIG. 11 illustrates an exemplary flash memory system with soft data generation in accordance with the present invention.

FIG. 11 illustrates an exemplary flash memory system 1100 with controller-based soft data generation in accordance with one embodiment of the present invention. As shown in FIG. 11, the exemplary flash memory system 1100 comprises a flash memory block 1110 and a flash control system 1120, connected by an interface 1115. As discussed hereinafter, soft or hard data values (or both) can be assigned by the flash memory block 1110 and are transferred over the interface 1115 to the flash control system 1120 for further decoding and processing. The exemplary flash control system 1120 comprises a soft demapper/soft data generator 1200, discussed further below in conjunction with FIGS. 12A and 12B, and a decoder 1400, discussed further below in conjunction with FIGS. 13-14. The decoder 1400 may be embodied, for example, using an LDPC decoding algorithm, such as a Belief Propagation, Message Passing, Sum-Product or Min-Sum algorithm.

As shown in FIG. 11, the soft information generated by the soft demapper/soft data generator 1200 can optionally be used for iterative demapping and decoding between the soft demapper/soft data generator 1200 and the decoder 1400. Generally, as shown in FIG. 11, the soft demapper/soft data generator 1200 generates soft information in the form of LLRs, $L_e$, as discussed below in the section entitled "Computation of Soft Data (LLRs) Using Read Statistics." Initially, the LLRs, $L_e$, computed by the soft demapper/soft data generator 1200 are based on the soft or hard readouts (or both) from the flash memory 1110 and the corresponding statistics. The LLRs, $L_e$, are processed by the decoder 1400 to generate new soft information, $L_a$, that is fed back to the soft demapper/soft data generator 1200 in an iterative manner, until the iterative process converges to a final decision.

Soft Demapper/Soft Data Generator 1200

Figure 12A:
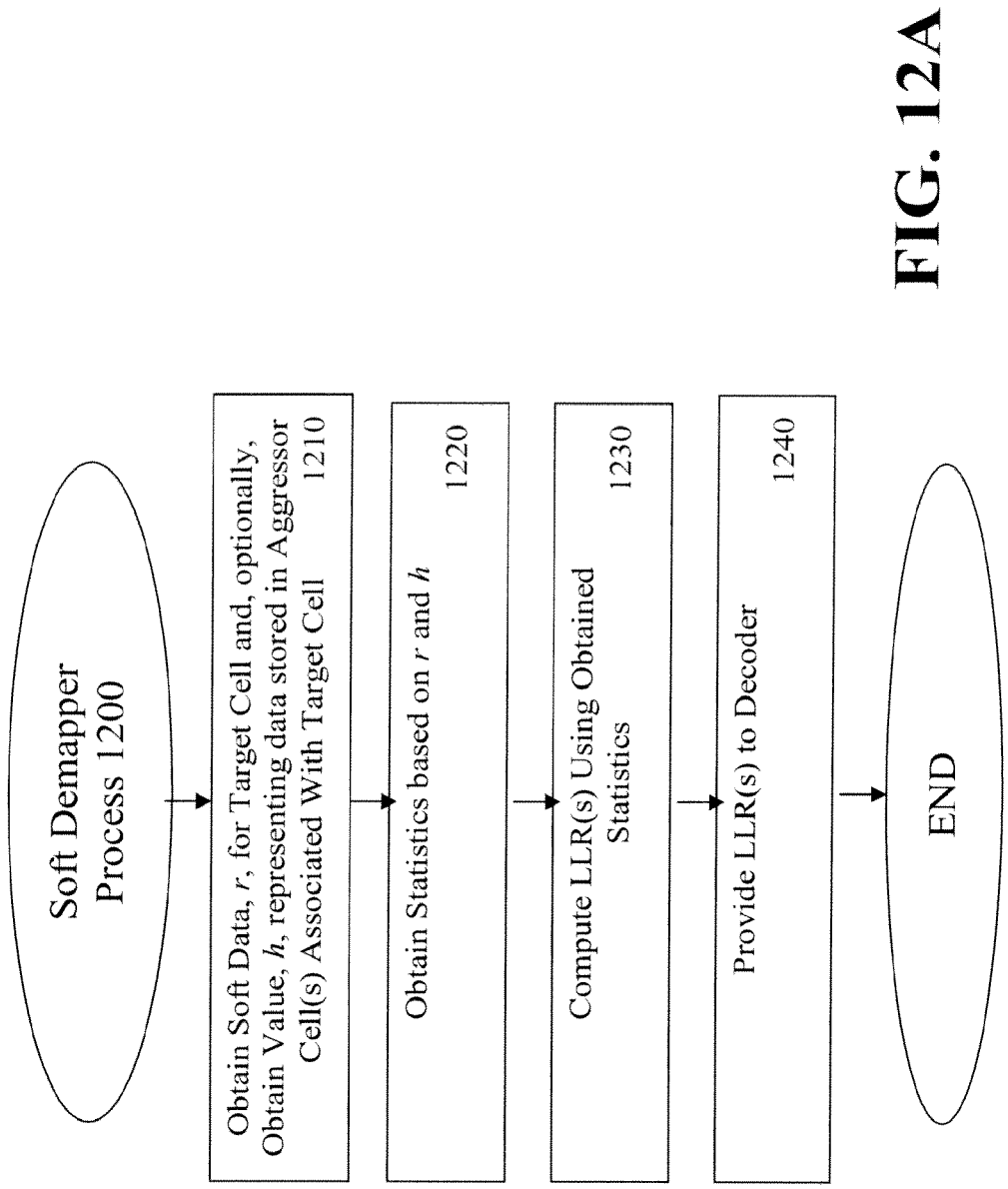
FIGS. 12A and 12B are flow charts describing exemplary soft demapping and soft data generation processes, respectively.

FIG. 12A is a flow chart describing an exemplary soft demapping process 1200 incorporating features of the present invention to generate enhanced soft data from soft data provided by the flash memory 810, 910. As shown in FIG. 12A, the exemplary soft demapping process 1200 initially obtains soft data, r, from the flash memory 810, 910 for the target cell during step 1210, and, optionally, one or more values, h, representing data stored in the aggressor cell(s) associated with the target cell.

The soft demapping process 1200 then obtains statistics (or probabilities) based on r and optionally h during step 1220, such as one or more probability density functions. The statistics are discussed further below in the section entitled "Collection of Statistics."

The obtained statistics are then used during step 1230 to compute the LLR(s). The LLR(s) are discussed below in the section entitled "Computation of Soft Data (LLRs) Using Read Statistics." The computed LLRs are then provided to the decoder 1400 during step 1240, or optionally to a deinterleaver. The computed LLRs may optionally be used to make a final decision on the read data, for example, based on the sign of the LLRs.

Figure 12B:
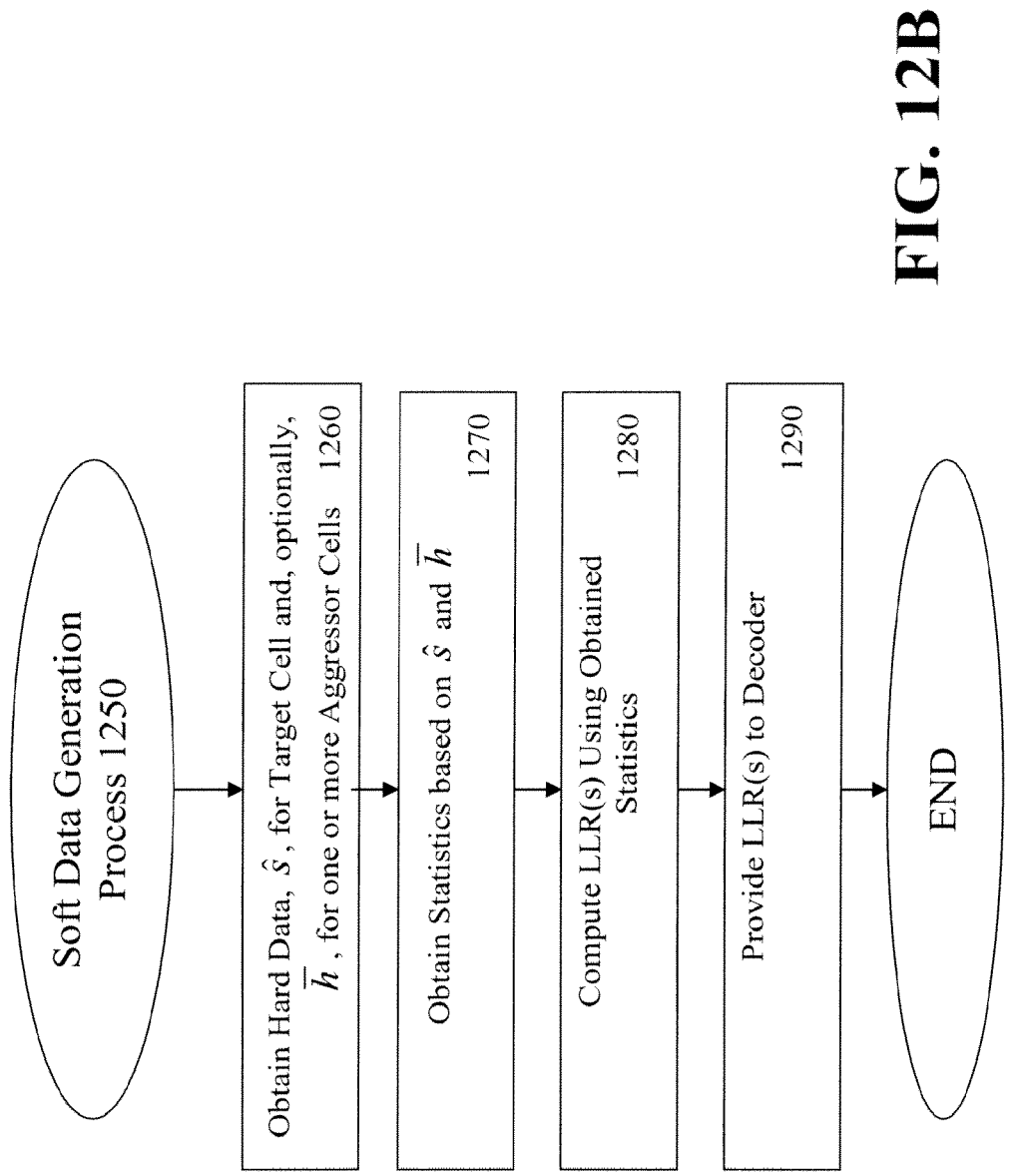

FIG. 12B is a flow chart describing an exemplary soft data generation process 1250 incorporating features of the present invention to generate soft data from hard data provided by the flash memory 810, 910. As shown in FIG. 12B, the exemplary soft data generation process 1250 initially obtains hard data, $\hat{s}$, from the flash memory 810, 910 for the target cell during step 1260, and, optionally, one or more values, $\bar{h}$, representing data stored in the aggressor cell(s) associated with the target cell. The hard data, $\hat{s}$, may be, for example, binary bits or levels assigned to each cell by the flash memory 810, 910.

To compute the LLR for one bit in a cell and the other bits are not available, the other bits in the cell are read using, for example, page and wordline access techniques. For a more detailed discussion of exemplary page or wordline level access techniques, see, for example, International Patent Application Serial No. PCT/US09/36810, filed Mar. 11, 2009, entitled "Methods and Apparatus for Storing Data in a Multi-Level Cell Flash Memory Device with Cross-Page Sectors, Multi-Page Coding and Per-Page Coding," (now U.S. Pat. No. 8,724,381), incorporated by reference herein. With page access techniques, the page for which LLRs are being computed is read, and optionally, the other pages within the same wordline can be read as well, so that the hard data can be mapped to levels $\hat{s}$ for the cells. With wordline access techniques, an entire wordline can be read to obtain all the bits within a cell, from which the hard data level $\hat{s}$ is obtained.

The pattern $\bar{h}$ is obtained, for example, by reading out bits from aggressor cells 720 (or pages or wordlines in which the aggressor cells 720 are stored). For a more detailed discussion of techniques for reading out bits from aggressor cells, see, for example, International Patent Application Serial No. PCT/US09/49326, entitled "Methods and Apparatus for Read-Side Intercell Interference Mitigation in Flash Memories," (now U.S. Pat. No. 8,462,549) incorporated by reference herein.

The soft data generation process 1250 then obtains statistics (or probabilities) based on ŝ and optionally $\bar{h}$ during step 1270, such as one or more probability density functions. The statistics can also be bit-based or cell-based probabilities, as discussed further below in the section entitled "Collection of Statistics." When a Gaussian approximation for the distribution of soft read values is employed, the statistics comprise the mean values or variances of the distributions, as discussed in the section entitled "Computation of Soft Data (LLRs) Using Read Statistics" for the various Gaussian approximation equation. The mean values and variances can be precomputed, for example, during characterization of flash memory chips for different performance factors, such as program/erase cycles, read cycles and temperature, and stored in tables. The mean values and variances can be obtained from the tables based on the performance factors, and optionally also based on the pattern $\bar{h}$ stored in the aggressor cells 720.

The obtained statistics are then used during step 1280 to compute the LLR(s). The LLR(s) are discussed below in the section entitled "Computation of Soft Data (LLRs) Using Read Statistics." It is noted that in addition to, or instead of, the statistics, a-priori LLRs $L_a$ provided by the decoder can optionally be used to compute the LLRs, as explained in the section entitled "Computation of Soft Data (LLRs) Using Read Statistics." When the LLR for a bit in a cell is computed, the a-priori LLR $L_a$ is used for at least one bit (optionally all other bits) within a cell. This requires that these other bits in the cell have been read and a-priori LLRs $L_a$ have been computed for them by the decoder.

The computed LLRs are then provided to the decoder 1400 during step 1290, or optionally to a deinterleaver. The computed LLRs may optionally be used to make a final decision on the read data, for example, based on the sign of the LLRs. It is noted that all bits within a cell (or all pages within a wordline) can be encoded and decoded jointly as described in International Patent Application Serial No. PCT/US09/36810, filed Mar. 11, 2009, entitled "Methods and Apparatus for Storing Data in a Multi-Level Cell Flash Memory Device with Cross-Page Sectors, Multi-Page Coding and Per-Page Coding," (now U.S. Pat. No. 8,724,381). In another embodiment, the bits within a cell (or all pages within a wordline) can be encoded and decoded separately, again as described in International Patent Application Serial No. PCT/US09/36810.

Decoder 1400—LDPC Implementation

The following background discussion of LDPC codes and LDPC decoding is based on a discussion in, A. J. Blanksby and C. J. Howland, "A 690-mW 1-Gb/s 1024-b, Rate-1/2 Low-Density Parity-Check Decoder," IEEE J. Solid-State Circuits, Vol. 37, 404-412 (March 2002), incorporated by reference herein. For a more detailed discussion, the reader is referred to the full Blanksby and Howland paper.

Graph Representation of LDPC Codes

Figure 13:
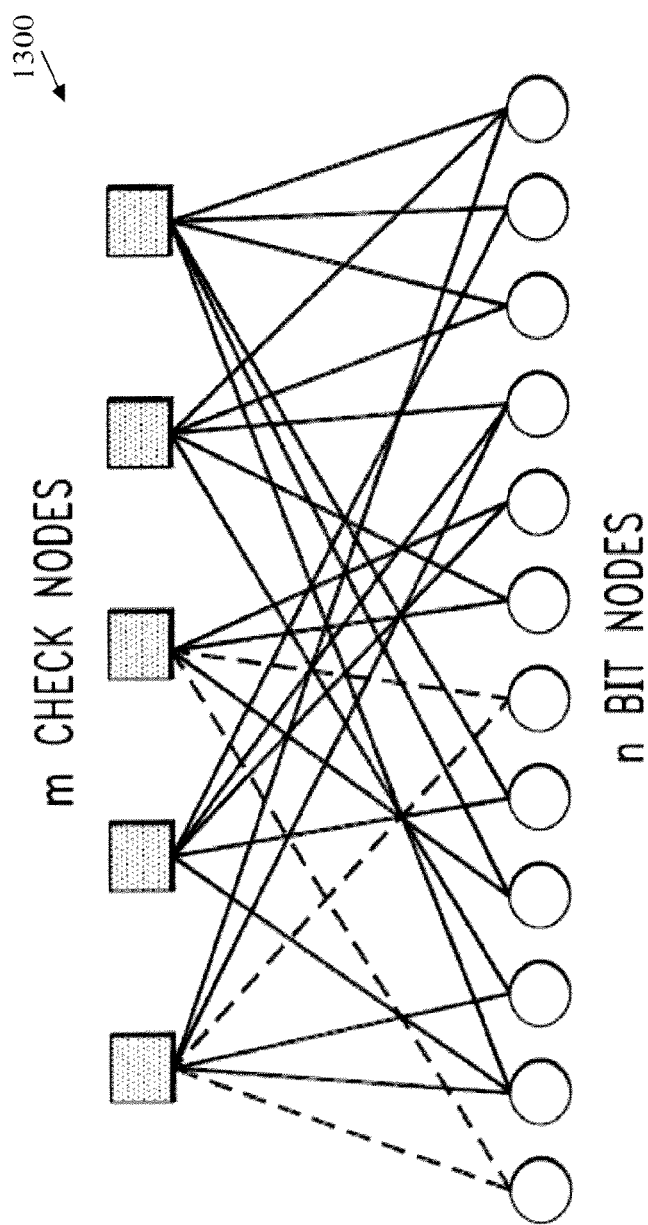
FIG. 13 is an exemplary bipartite graph representation of a low-density parity-check (LDPC) code.

LDPC codes can also be represented using a bipartite graph, where one set of nodes represents the parity check constraints and the other set represents the data bits. FIG. 13 is an exemplary bipartite graph representation 1300 of an LDPC code. The parity check matrix is the incidence matrix of the graph where a bit node i, corresponding to column i in H, is connected to check node j, corresponding to row j in H, if the entry $h_{j,i}$ in H is set, i.e., non-zero.

One algorithm used for decoding LDPC codes is known as the sum-product algorithm. For good decoding performance with this algorithm, it is important that the length of cycles in the graph representation of the LDPC code is as long as possible. In the exemplary representation of FIG. 13, an exemplary short cycle of length four has been illustrated. Short cycles, such as the length-4 cycle illustrated in FIG. 13, degrade the performance of the sum-product algorithm. Another well-known algorithm for decoding LDPC codes is the min-sum algorithm.

The Sum-Product Algorithm

The sum-product algorithm is an iterative algorithm for decoding LDPC codes. The sum-product algorithm is also known as the message passing algorithm or belief propagation. For a more detailed discussion of the sum-product algorithm, see, for example, A. J. Blanksby and C. J. Howland, "A 690-mW 1-Gb/s 1024-b, Rate-1/2 Low-Density Parity-Check Decoder," IEEE J. Solid-State Circuits, Vol. 37, 404-412 (March 2002), D. E. Hocevar, "LDPC Code Construction With Flexible Hardware Implementation," IEEE Intl Conf. on Comm. (ICC), Anchorage, Ak., 2708-2712 (May, 2003), and R. N. S. Ratnayake, E. F. Haratsch and Gu-Yeon Wei, "A Bit-node centric architecture for low-density parity check decoders," IEEE Global Telecommunications Conference (Globecom), Washington, D.C., 265-270 (November 2007) each incorporated by reference herein.

The message, $Q_{i,j}$, from bit node i to check node j is given by:

$$Q_{i,j} = \sum_{l \in B_i, l \neq j} R_{l,i} + L_{e,i}$$

where $L_{e,i}$ is extrinsic LLR provided by the soft demapper/soft data generator for bit i. The message, $R_{j,i}$, from check node j to bit node i is given by:

$$R_{j,i} = s_{j,i} \cdot \phi\left(\sum_{l \in C_j, l \neq i} \phi(|Q_{l,j}|)\right)$$

where:

$$s_{j,i} = \prod_{l \in C_j, l \neq i} \text{sign}(Q_{l,j}); \text{ and}$$

$$\phi(x) = -\log\tanh(x/2) = \log\frac{e^x + 1}{e^x - 1}.$$

The a-posteriori information value, which is also called a-posteriori log-likelihood ratio (LLR), for bit i, $\Lambda_i$, is given by:

$$\Lambda_i = \sum_{l \in B_i} R_{l,i} + L_{e,i}.$$

The LLR $L_{a,i}$ for bit i provided to the soft demapper/soft data generator for iterative demapping and decoding is given as follows:

$$L_{a,i} = \sum_{l \in B_i} R_{l,i}$$

where $B_i$ is the set of check nodes connected to bit node i; and $C_j$ is the set of bit nodes connected to check node j.

LDPC Decoder—Hardware-Sharing Decoder Architecture

A significant challenge when implementing the sum-product algorithm for decoding LDPC codes is managing the passing of the messages. As the functionality of both the check and bit nodes is relatively simple, their respective realizations involve only a small number of gates. The main issue is the implementation of the bandwidth required for passing messages between the functional nodes.

Figure 14:
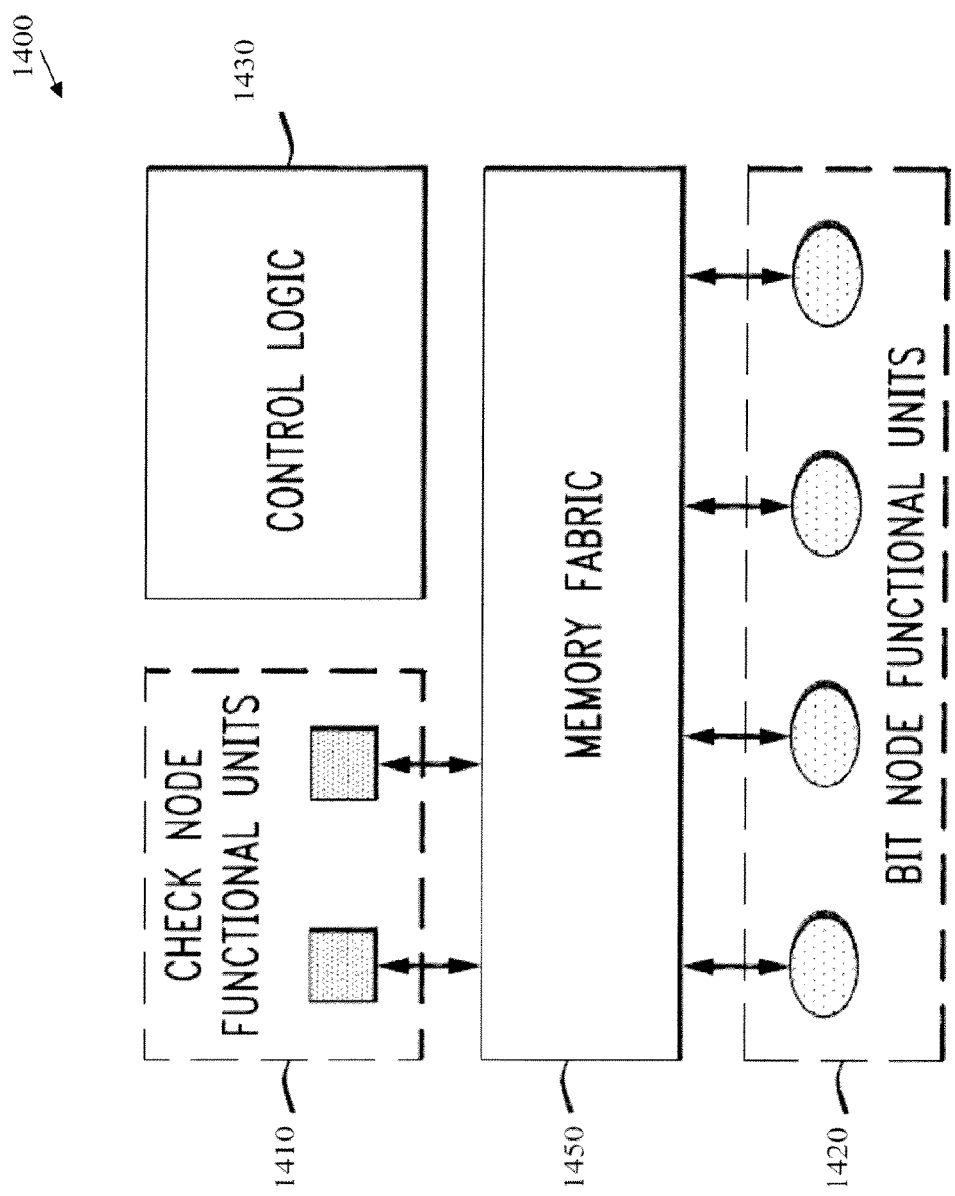
FIG. 14 is a block diagram of an exemplary LDPC decoder architecture.

FIG. 14 is a block diagram of an exemplary hardware-sharing LDPC decoder architecture 1400. As shown in FIG. 14, the generalized LDPC decoder architecture 1400 comprises a number of functional units 1410, 1420 implementing either the check or bit node functionality, respectively, and a memory fabric 1450 to store the messages and realize the graph connectivity. Control logic 1430 controls the configuration of the memory fabric 1450. For a detailed discussion of an implementation of a hardware-sharing LDPC decoder architecture 1400, see, for example, E. Yeo et al., "VLSI Architectures for Iterative Decoders in Magnetic Recording Channels," IEEE Trans. On Magnetics, Vol. 37, No. 2, 748-755 (March 2001).

It has been recognized that such a hardware-sharing architecture reduces the area of the decoder.

Figure 15:
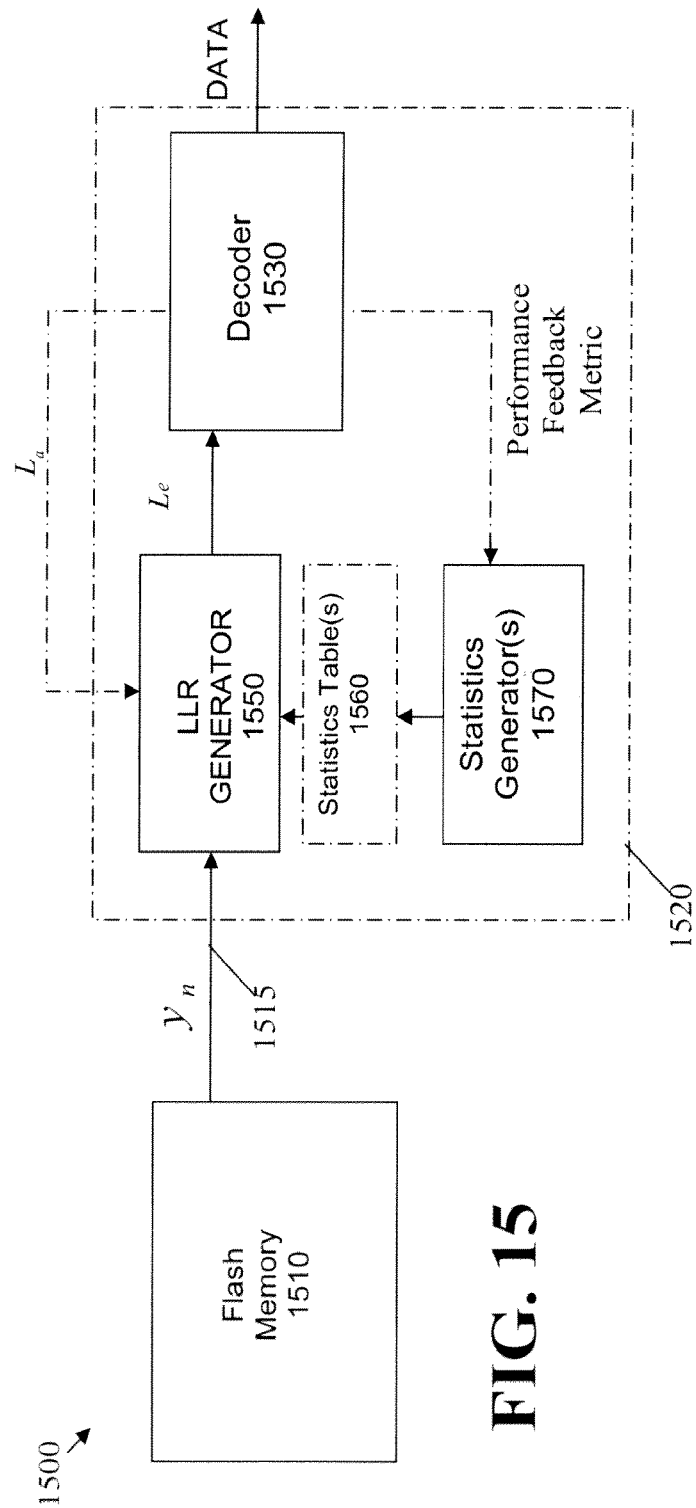
FIG. 15 illustrates an exemplary flash memory system with soft data generation in accordance with one embodiment of the present invention.

FIG. 15 illustrates an exemplary flash memory system 1500 with soft data generation in accordance with one embodiment of the present invention. As shown in FIG. 15, the exemplary flash memory system 1500 comprises a flash memory block 1510. As discussed hereinafter, hard or soft data values (or both) are typically assigned by the flash memory block 1510 and are transferred over the interface 1515 to the flash control system 1520 for further decoding and processing. The exemplary flash control system 1520 comprises an LLR generator 1550, discussed further below in conjunction with FIG. 16, a statistics generator(s) 1570, discussed further below in a section entitled "Collection of Statistics," and a decoder 1530. The statistics generated by the statistics generator(s) 1570 are optionally recorded in one or more statistics table(s) 1560, discussed further below, for example, in conjunction with FIGS. 17A through 17C and 18, or alternatively, can be generated in real-time.

The statistics generated by the statistics generator(s) 1570 are used by the LLR generator 1550 to generate the soft data, for example, in the form of LLRs, $L_e$. Initially, the LLRs, $L_e$, are based on the soft or hard readouts (or both) from the flash memory 1510 and the corresponding statistics. The LLRs, $L_e$, are processed by the decoder 1530 to generate new soft information, $L_a$, that is fed back to the LLR generator 1550 in an iterative manner, until the iterative process converges to a final decision.

The decoder 1530 may again be embodied, for example, using an LDPC decoding algorithm, such as a Belief Propagation, Message Passing, Sum-Product or Min-Sum algorithm. It is noted that the functions of the statistics generator 1570 and LLR generator 1550 described herein can be implemented in one or more of the flash control system 1520, decoder 1530 and read channel 825 (see FIG. 8, for example).

Computation of Soft Data (LLRs) Using Read Statistics

The a priori log likelihood ratio (LLR), $L_a$, for a bit, c, can be defined as follows:

$$L_a(c) = \log \frac{P(c=0)}{P(c=1)}$$

where P( . . . ) is a probability.

Likewise, the LLR of bit c conditioned on the flash output, r, is computed as follows:

$$L(c \mid r) = \log \frac{P(c=0 \mid r)}{P(c=1 \mid r)}$$
$$= \log \frac{P(c=0)}{P(c=1)} + \log \frac{p(r \mid c=0)}{p(r \mid c=1)}$$
$$= L_a(c) + L_e(c)$$

where $L_e(c)$ is the extrinsic LLR or soft information that is passed to a subsequent decoder, and p( . . . ) is a probability density function (PDF).

Figure 16:
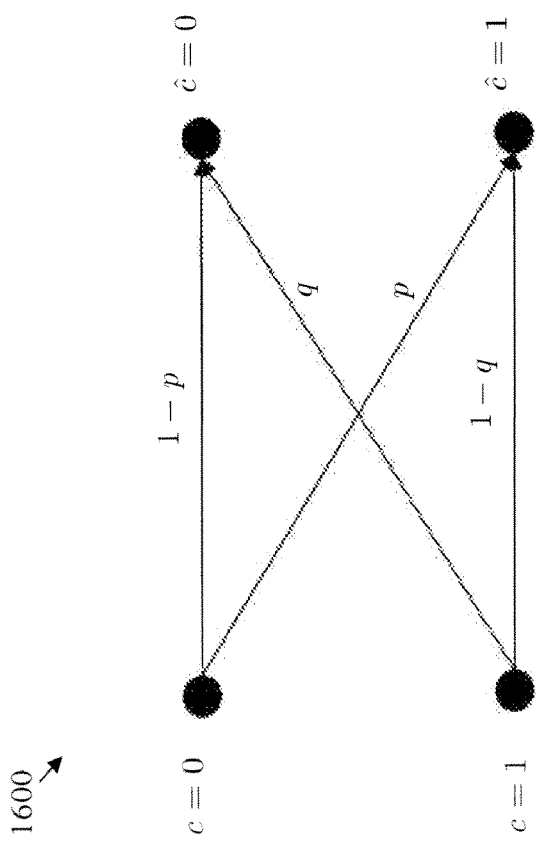
FIG. 16 is a trellis illustrating the error probabilities, p and q, for an exemplary binary channel.

FIG. 16 is a trellis 1600 illustrating the error probabilities, p and q, for an exemplary binary channel. Note that in the context of binary channels, p denotes an error probability, while p( . . . ) otherwise denotes a probability density function. When p≠q, this binary channel is asymmetric. When p=q, this binary channel is symmetric. As shown in FIG. 16, p is the error probability for a binary zero (i.e., the probability of reading a one when a zero was written). Likewise, q is the error probability for a binary one (i.e., the probability of reading a zero when a one was written). The probability of properly reading a binary zero (i.e., the probability of reading a zero when a zero was written) can be expressed as 1−p. Similarly, the probability of properly reading a binary one (i.e., the probability of reading a one when a one was written) can be expressed as 1−q.

Extrinsic LLR for Binary Asymmetric Channel

The extrinsic LLR, $L_e(c)$, of bit c for the binary asymmetric channel defined by the trellis 1600 can be expressed as follows:

$$L_e(c) = \log \frac{P(\hat{c} \mid c=0)}{P(\hat{c} \mid c=1)}.$$

The extrinsic LLR, $L_e(c)$, for a read bit, $\hat{c}=0$, is computed as:

$$L_e(c) = \log \frac{P(\hat{c}=0 \mid c=0)}{P(\hat{c}=0 \mid c=1)} = \log \frac{1-p}{q}.$$

The extrinsic LLR, $L_e(c)$, for a read bit, $\hat{c}=1$, is computed as:

$$L_e(c) = \log \frac{P(\hat{c}=1 \mid c=0)}{P(\hat{c}=1 \mid c=1)} = \log \frac{p}{1-q}.$$

Extrinsic LLR for Binary Symmetric Channel (where $p=q=p_0$)

The extrinsic LLR, $L_e(c)$, for a read bit, $\hat{c}=0$, is computed as:

$$L_e(c) = \log\frac{P(\hat{c}=0\mid c=0)}{P(\hat{c}=0\mid c=1)} = \log\frac{1-p_0}{p_0}.$$

The extrinsic LLR, $L_e(c)$, for a read bit, $\hat{c}=1$, this LLR is computed as:

$$L_e(c) = \log\frac{P(\hat{c}=1\mid c=0)}{P(\hat{c}=1\mid c=1)} = \log\frac{p_0}{1-p_0}.$$

Extrinsic LLRs for Soft Outputs from Flash Memory:

For a 2-Bits/cell flash memory, the extrinsic LLR can be computed as follows for a soft value, r, received from the flash memory 810, 910:

$$\begin{aligned}L_e(c_0) &= \log\frac{p(r\mid c_0=0)}{p(r\mid c_0=1)} \\ &= \log\frac{P(c_0=0)}{P(c_0=1)} \cdot \frac{P(c_0=0,c_1=0\mid r)+P(c_0=0,c_1=1\mid r)}{P(c_0=1,c_1=0\mid r)+P(c_0=1,c_1=1\mid r)} \\ &= \log\frac{p(r\mid c_0=0,c_1=0)+\frac{P(c_1=1)}{P(c_1=0)}p(r\mid c_0=0,c_1=1)}{p(r\mid c_0=1,c_1=0)+\frac{P(c_1=1)}{P(c_1=0)}p(r\mid c_0=1,c_1=1)} \\ &= \log\frac{p(r\mid c_0=0,c_1=0)+\exp(-L_a(c_1))\cdot p(r\mid c_0=0,c_1=1)}{p(r\mid c_0=1,c_1=0)+\exp(-L_a(c_1))\cdot p(r\mid c_0=1,c_1=1)}.\end{aligned}$$

In general, for any number of bits per cell, the extrinsic LLR for bit C can be expressed as $$L_e(C_i) = \log\frac{\sum_{s\in\chi_0^i} p(r\mid s)\cdot \prod_{j=1,j\neq i}^{m} \exp(-L_a(C_j)\cdot c_j)}{\sum_{s\in\chi_1^i} p(r\mid s)\cdot \prod_{j=1,j\neq i}^{m} \exp(-L_a(C_j)\cdot c_j)},$$

where:
r: received signal
s: original stored state or level given by stored bits ($c_0$, $c_1$, ... $c_m$)
$c_j$: coded bit
m bits per cell $$L_a(C_i) = \log\frac{P(C_i=0)}{P(C_i=1)}:$$

a-priori LLR
$L_e(C_i)$: extrinsic LLR
$X_{c_i}^i$: subset of states or levels whose bit labels have the value $C_i=c_i$ in position i, where $L_a(C_i)$ is for example provided by a decoder, such as LDPC decoder 1090 or 1400. In the first iteration, $L_a(C_i)$ can be initialized to 0.

Using the following equality:

$$p(r\mid s) = \frac{p(r)}{P(s)}\cdot P(s\mid r),$$

the expression for the extrinsic LLR can also be written as follows:

$$L_e(C_i) = \log\frac{\sum_{s\in\chi_0^i} \frac{P(s\mid r)}{P(s)}\cdot \prod_{j=1,j\neq i}^{m} \exp(-L_a(C_j)\cdot c_j)}{\sum_{s\in\chi_1^i} \frac{P(s\mid r)}{P(s)}\cdot \prod_{j=1,j\neq i}^{m} \exp(-L_a(C_j)\cdot c_j)}$$

This expression can be further simplified to:

$$L_e(C_i) = \log\frac{\sum_{s\in\chi_0^i} P(s\mid r)\cdot \prod_{j=1,j\neq i}^{m} \exp(-L_a(C_j)\cdot c_j)}{\sum_{s\in\chi_1^i} P(s\mid r)\cdot \prod_{j=1,j\neq i}^{m} \exp(-L_a(C_j)\cdot c_j)}$$

This expression is mathematically equivalent to the above expression if all states or levels are equally likely.

Pattern-Dependent Extrinsic LLRs for Soft Outputs from Flash Memory

For one or more soft values, r, for the target cell and one or more values, $\bar{h}$, for the aggressor cell(s), received from the flash memory 860, 960, it can be shown that:

$$L_e(C_i) = \log\frac{\sum_{s\in\chi_0^i} p(r,\bar{h}\mid s)\cdot \prod_{j=1,j\neq i}^{m} \exp(-L_a(C_j)\cdot c_j)}{\sum_{s\in\chi_1^i} p(r,\bar{h}\mid s)\cdot \prod_{j=1,j\neq i}^{m} \exp(-L_a(C_j)\cdot c_j)},$$

where $\bar{h}$ is the data pattern stored in the surrounding cell(s) or in other cells that cause disturbance on the target cell. For example:

$\bar{h}=(h^{k\pm 1,l}, h^{k,l\pm 1}, h^{k\pm 1,l\pm 1})$ denotes all aggressor cells that are adjacent to the target cell at location (k,l) for which the LLR is being computed.

The pattern $\bar{h}$ can be obtained for example by reading out hard data from the aggressor cells.

The expression for the extrinsic LLR can also be written as follows:

$$L_e(C_i) = \log\frac{\sum_{s\in\chi_0^i} \frac{P(s\mid r,\bar{h})}{P(s)}\cdot \prod_{j=1,j\neq i}^{m} \exp(-L_a(C_j)\cdot c_j)}{\sum_{s\in\chi_1^i} \frac{P(s\mid r,\bar{h})}{P(s)}\cdot \prod_{j=1,j\neq i}^{m} \exp(-L_a(C_j)\cdot c_j)}.$$

This expression can be further simplified to:

$$L_e(C_i) = \frac{\log \sum_{s \in \chi_0^i} P(s \mid r, \overline{h}) \prod_{j=1, j \neq i}^{m} \exp(-L_a(C_j) \cdot c_j)}{\sum_{s \in \chi_1^i} P(s \mid r, \overline{h}) \prod_{j=1, j \neq i}^{m} \exp(-L_a(C_j) \cdot c_j)}.$$

This expression is mathematically equivalent to the above expression if all states are equally likely.

Extrinsic LLRs for Hard Outputs from Flash Memory

When soft outputs are not available from the flash memory, and the flash memory provides only hard data ŝ, which is the state or level assigned to the stored data by the flash memory, the extrinsic LLR can be computed as:

$$L_e(C_i) \approx \log \frac{\sum_{s \in \chi_0^i} p(E\{r \mid \hat{s}\} \mid s) \cdot \prod_{j=1, j \neq i}^{m} \exp(-L_a(C_j) \cdot c_j)}{\sum_{s \in \chi_1^i} p(E\{r \mid \hat{s}\} \mid s) \cdot \prod_{j=1, j \neq i}^{m} \exp(-L_a(C_j) \cdot c_j)}$$

$$\approx \log \frac{\sum_{s \in \chi_0^i} P(\hat{s} \mid s) \cdot \prod_{j=1, j \neq i}^{m} \exp(-L_a(C_j) \cdot c_j)}{\sum_{s \in \chi_1^i} P(\hat{s} \mid s) \cdot \prod_{j=1, j \neq i}^{m} \exp(-L_a(C_j) \cdot c_j)}$$

where $E\{r \mid \hat{s}\}$ is the expected value for the soft value r (such as voltage) or some other estimate for the soft value r assuming the hard value ŝ. $P(\hat{s} \mid s)$ is the probability that the hard value (such as state or level) ŝ is read assuming that the state or level s was originally written stored.

The extrinsic LLR can be computed alternatively as:

$$L_e(C_i) \approx \log \frac{\sum_{s \in \chi_0^i} \frac{P(s \mid E\{r \mid \hat{s}\})}{P(s)} \prod_{j=1, j \neq i}^{m} \exp(-L_a(C_j) \cdot c_j)}{\sum_{s \in \chi_1^i} \frac{P(s \mid E\{r \mid \hat{s}\})}{P(s)} \prod_{j=1, j \neq i}^{m} \exp(-L_a(C_j) \cdot c_j)}$$

$$\approx \frac{\sum_{s \in \chi_0^i} \frac{P(s \mid \hat{s})}{P(s)} \prod_{j=1, j \neq i}^{m} \exp(-L_a(C_j) \cdot c_j)}{\sum_{s \in \chi_1^i} \frac{P(s \mid \hat{s})}{P(s)} \prod_{j=1, j \neq i}^{m} \exp(-L_a(C_j) \cdot c_j)}$$

$$\approx \frac{\sum_{s \in \chi_0^i} P(s \mid \hat{s}) \cdot \prod_{j=1, j \neq i}^{m} \exp(-L_a(C_j) \cdot c_j)}{\sum_{s \in \chi_1^i} P(s \mid \hat{s}) \cdot \prod_{j=1, j \neq i}^{m} \exp(-L_a(C_j) \cdot c_j)}$$

where $P(s \mid \hat{s})$ is the probability that the state or level s was originally written or stored assuming that the hard value (such as state or level) ŝ is read.

Pattern-Dependent Extrinsic LLRs for Hard Outputs from Flash Memory

When soft outputs are not available from the flash memory, and the flash memory provides only hard data ŝ, which is the state or level assigned to the stored data by the flash memory, the extrinsic LLR can be computed based on the pattern $\overline{h}$ stored in aggressor cells:

$$L_e(C_i) \approx \log \frac{\sum_{s \in \chi_0^i} p(E\{r \mid \hat{s}, \overline{h}\}, \overline{h} \mid s) \cdot \prod_{j=1, j \neq i}^{m} \exp(-L_a(C_j) \cdot c_j)}{\sum_{s \in \chi_1^i} p(E\{r \mid \hat{s}, \overline{h}\}, \overline{h} \mid s) \cdot \prod_{j=1, j \neq i}^{m} \exp(-L_a(C_j) \cdot c_j)}$$

$$\approx \log \frac{\sum_{s \in \chi_0^i} P(\hat{s}, \overline{h} \mid s) \cdot \prod_{j=1, j \neq i}^{m} \exp(-L_a(C_j) \cdot c_j)}{\sum_{s \in \chi_1^i} P(\hat{s}, \overline{h} \mid s) \cdot \prod_{j=1, j \neq i}^{m} \exp(-L_a(C_j) \cdot c_j)}$$

where $P(\hat{s}, \overline{h} \mid s)$ is the probability that the hard value (such as state or level) ŝ is read and the pattern in aggressor cells is $\overline{h}$ assuming that the state or level s was originally written stored. $\overline{h}$ is the data pattern stored in the surrounding cell(s) or in other cells that cause disturbance on the target cell. For example:

$\overline{h} = (h^{k \pm 1, l}, h^{k, l \pm 1}, h^{k \pm 1, l \pm 1})$ denotes all aggressor cells that are adjacent to the target cell at location (k,l) for which the LLR is being computed.

The pattern $\overline{h}$ can be obtained for example by reading out hard data from the aggressor cells.

The pattern-dependent LLRs can be computed alternatively as:

$$L_e(C_i) \approx \log \frac{\sum_{s \in \chi_0^i} \frac{P(s \mid E\{r \mid \hat{s}, \overline{h}\}, \overline{h})}{P(s)} \prod_{j=1, j \neq i}^{m} \exp(-L_a(C_j) \cdot c_j)}{\sum_{s \in \chi_1^i} \frac{P(s \mid E\{r \mid \hat{s}, \overline{h}\}, \overline{h})}{P(s)} \prod_{j=1, j \neq i}^{m} \exp(-L_a(C_j) \cdot c_j)}$$

$$\approx \frac{\sum_{s \in \chi_0^i} \frac{P(s \mid \hat{s}, \overline{h})}{P(s)} \prod_{j=1, j \neq i}^{m} \exp(-L_a(C_j) \cdot c_j)}{\sum_{s \in \chi_1^i} \frac{P(s \mid \hat{s}, \overline{h})}{P(s)} \prod_{j=1, j \neq i}^{m} \exp(-L_a(C_j) \cdot c_j)}$$

$$\approx \frac{\sum_{s \in \chi_0^i} P(s \mid \hat{s}, \overline{h}) \cdot \prod_{j=1, j \neq i}^{m} \exp(-L_a(C_j) \cdot c_j)}{\sum_{s \in \chi_1^i} P(s \mid \hat{s}, \overline{h}) \cdot \prod_{j=1, j \neq i}^{m} \exp(-L_a(C_j) \cdot c_j)}$$

where $P(s \mid \hat{s}, \overline{h})$ is the probability that the state or level s was originally written or stored assuming that the hard value (such as state or level) ŝ is read and the pattern in aggressor cells is $\overline{h}$.

Extrinsic LLRs Without Soft Decoder Feedback for Soft Outputs from Flash

When no soft outputs from the decoder are used in the soft demapper/soft data generator (in other words $L_a(C_i)=0$), the extrinsic LLRs in the soft demapper/soft data generator can be computed as follows:

$$L_e(C_i) = \log \frac{\sum_{s \in \chi_0^i} p(r|s)}{\sum_{s \in \chi_1^i} p(r|s)}$$

$$L_e(C_i) = \log \frac{\sum_{s \in \chi_0^i} \frac{P(s|r)}{P(s)}}{\sum_{s \in \chi_1^i} \frac{P(s|r)}{P(s)}} \approx \log \frac{\sum_{s \in \chi_0^i} P(s|r)}{\sum_{s \in \chi_1^i} P(s|r)}$$

These extrinsic LLRs are then passed to the decoder as shown in FIGS. 10 and 11. An LDPC can then apply for example a message-passage decoding algorithm for local iterations inside the decoder until the data bits are decoded. In this case, no global detection/decoding iterations between the soft demapper/soft data generator are performed to reduce the overall computation complexity.

Pattern-dependent LLRs can be computed in this case as follows:

$$L_e(C_i) = \log \frac{\sum_{s \in \chi_0^i} p(r, \bar{h}|s)}{\sum_{s \in \chi_1^i} p(r, \bar{h}|s)}$$

$$L_e(C_i) = \log \frac{\sum_{s \in \chi_0^i} \frac{P(s|r, \bar{h})}{P(s)}}{\sum_{s \in \chi_1^i} \frac{P(s|r, \bar{h})}{P(s)}} \approx \log \frac{\sum_{s \in \chi_0^i} P(s|r, \bar{h})}{\sum_{s \in \chi_1^i} P(s|r, \bar{h})}$$

Extrinsic LLRs without Soft Decoder Feedback for Hard Outputs from Flash

If no soft data is available from the flash memory, and no soft outputs from the decoder are used to reduce the computation complexity, the extrinsic LLRs can be compute as follows:

$$L_e(C_i) \approx \log \frac{\sum_{s \in \chi_0^i} p(E\{r|\hat{s}\}|s)}{\sum_{s \in \chi_1^i} p(E\{r|\hat{s}\}|s)}$$

$$\approx \log \frac{\sum_{s \in \chi_0^i} P(\hat{s}|s)}{\sum_{s \in \chi_1^i} P(\hat{s}|s)}$$

where $E\{r|\hat{s}\}$ is the expected value for the soft value r (such as voltage) or some other estimate for the soft value r assuming the hard value $\hat{s}$. $P(\hat{s}|s)$ is the probability that the hard value (such as state or level) $\hat{s}$ is read assuming that the state or level s was originally written stored.

In an alternative implementation, the LLRs can be computed as:

$$L_e(C_i) \approx \log \frac{\sum_{s \in \chi_0^i} \frac{P(s|E\{r|\hat{s}\})}{P(s)}}{\sum_{s \in \chi_1^i} \frac{P(s|E\{r|\hat{s}\})}{P(s)}}$$

$$\approx \frac{\sum_{s \in \chi_0^i} \frac{P(s|\hat{s})}{P(s)}}{\sum_{s \in \chi_1^i} \frac{P(s|\hat{s})}{P(s)}}$$

$$\approx \frac{\sum_{s \in \chi_0^i} P(s|\hat{s})}{\sum_{s \in \chi_1^i} P(s|\hat{s})}$$

where $P(s|\hat{s})$ is the probability that the state or level s was originally written or stored assuming that the hard value (such as state or level) $\hat{s}$ is read.

Pattern-dependent LLRs can be computed in this case as follows:

$$L_e(C_i) \approx \log \frac{\sum_{s \in \chi_0^i} P(\hat{s}, \bar{h}|s)}{\sum_{s \in \chi_1^i} P(\hat{s}, \bar{h}|s)}$$

$$L_e(C_i) \approx \frac{\sum_{s \in \chi_0^i} \frac{P(s|\hat{s}, \bar{h})}{P(s)}}{\sum_{s \in \chi_1^i} \frac{P(s|\hat{s}, \bar{h})}{P(s)}}$$

$$\approx \frac{\sum_{s \in \chi_0^i} P(s|\hat{s}, \bar{h})}{\sum_{s \in \chi_1^i} P(s|\hat{s}, \bar{h})}$$

Gaussian Approximation of Extrinsic LLRs for Soft Outputs from Flash

If the soft outputs from the flash memory (such as read threshold voltages) are modeled having Gaussian distributions, the conditional PDFs p(r|s) for soft output p(r) assuming originally stored or written level s can be expressed as:

$$p(r|s) = \frac{1}{\sqrt{2\pi}\,\sigma(s)} \exp\left(-\frac{1}{2\sigma(s)^2}(r - E\{r|s\})^2\right)$$

where $\sigma(s)$ is the standard deviation and $E\{r|s\}$ is the mean or expected value of the soft output (such as threshold voltage) for state s.

Then, the extrinsic LLRs can be computed as:

$$L_e(C_i) = \log \frac{\sum_{s\in\chi_0^i} \frac{1}{\sigma(s)}\exp\left(-\frac{1}{2\sigma(s)^2}(r-E\{r|s\})^2\right) \cdot \prod_{j=1,j\neq i}^{m} \exp(-L_a(C_j)\cdot c_j)}{\sum_{s\in\chi_1^i} \frac{1}{\sigma(s)}\exp\left(-\frac{1}{2\sigma(s)^2}(r-E\{r|s\})^2\right) \cdot \prod_{j=1,j\neq i}^{m} \exp(-L_a(C_j)\cdot c_j)} =$$

$$\log \frac{\sum_{s\in\chi_0^i} \frac{1}{\sigma(s)}\exp\left(-\frac{1}{2\sigma(s)^2}(r-E\{r|s\})^2 - \sum_{j=1,j\neq i}^{m} L_a(C_j)\cdot c_j\right)}{\sum_{s\in\chi_1^i} \frac{1}{\sigma(s)}\exp\left(-\frac{1}{2\sigma(s)^2}(r-E\{r|s\})^2 - \sum_{j=1,j\neq i}^{m} L_a(C_j)\cdot c_j\right)}$$

If the voltage distributions for all states have the same standard deviation $\sigma(s)=\sigma$, this equation can be simplified to the following expression:

$$L_e(C_i) = \log \frac{\sum_{s\in\chi_0^i} \exp\left(-\frac{1}{2\sigma^2}(r-E\{r|s\})^2\right) \cdot \prod_{j=1,j\neq i}^{m} \exp(-L_a(C_j)\cdot c_j)}{\sum_{s\in\chi_1^i} \exp\left(-\frac{1}{2\sigma^2}(r-E\{r|s\})^2\right) \cdot \prod_{j=1,j\neq i}^{m} \exp(-L_a(C_j)\cdot c_j)} =$$

$$\log \frac{\sum_{s\in\chi_0^i} \exp\left(-\frac{1}{2\sigma^2}(r-E\{r|s\})^2 - \sum_{j=1,j\neq i}^{m} L_a(C_j)\cdot c_j\right)}{\sum_{s\in\chi_1^i} \exp\left(-\frac{1}{2\sigma^2}(r-E\{r|s\})^2 - \sum_{j=1,j\neq i}^{m} L_a(C_j)\cdot c_j\right)}$$

This equation can be further simplified to:

$$L_e(C_i) \approx \max_{s\in\chi_0^i}\left[-\frac{1}{2\sigma^2}(r-E\{r|s\})^2 - \sum_{j=1,j\neq i}^{m} L_a(C_j)\cdot c_j\right] - \max_{s\in\chi_1^i}\left[-\frac{1}{2\sigma^2}(r-E\{r|s\})^2 - \sum_{j=1,j\neq i}^{m} L_a(C_j)\cdot c_j\right]$$

Gaussian Approximation of Extrinsic LLRs for Hard Outputs from Flash

When no soft output from the flash memory are available, the LLRs can be computed as the following assuming that the soft outputs are Gaussian distributed:

$$L_e(C_i) = \log \frac{\sum_{s\in\chi_0^i} \frac{1}{\sigma(s)}\exp\left(-\frac{1}{2\sigma(s)^2}(E\{r|\hat{s}\}-E\{r|s\})^2 - \sum_{j=1,j\neq i}^{m} L_a(C_j)\cdot c_j\right)}{\sum_{s\in\chi_1^i} \frac{1}{\sigma(s)}\exp\left(-\frac{1}{2\sigma(s)^2}(E\{r|\hat{s}\}-E\{r|s\})^2 - \sum_{j=1,j\neq i}^{m} L_a(C_j)\cdot c_j\right)}$$

where $E\{r|s\}$ is the mean or expected value of the soft output r (such as threshold voltage) for state s, and $E\{r|\hat{s}\}$ is the mean or expected value of the soft output r (such as threshold voltage) for the hard output $\hat{s}$, which is the state or level assigned and provided by the flash memory.

If the voltage distributions for all states have the same standard deviation $\sigma(s)=\sigma$, this equation can be simplified to the following expression:

$$L_e(C_i) = \log \frac{\sum_{s\in\chi_0^i} \exp\left(-\frac{1}{2\sigma^2}(E\{r|\hat{s}\}-E\{r|s\})^2 - \sum_{j=1,j\neq i}^{m} L_a(C_j)\cdot c_j\right)}{\sum_{s\in\chi_1^i} \exp\left(-\frac{1}{2\sigma^2}(E\{r|\hat{s}\}-E\{r|s\})^2 - \sum_{j=1,j\neq i}^{m} L_a(C_j)\cdot c_j\right)}$$

This equation can be further simplified to:

$$L_e(C_i) \approx \max_{s\in\chi_0^i}\left[-\frac{1}{2\sigma^2}(E\{r|\hat{s}\}-E\{r|s\})^2 - \sum_{j=1,j\neq i}^{m} L_a(C_j)\cdot c_j\right] - \max_{s\in\chi_1^i}\left[-\frac{1}{2\sigma^2}(E\{r|\hat{s}\}-E\{r|s\})^2 - \sum_{j=1,j\neq i}^{m} L_a(C_j)\cdot c_j\right]$$

Gaussian Approximation of Pattern-Dependent Extrinsic LLRs for Hard Outputs from Flash Memory Pattern-dependent LLRs for Hard outputs can be computed as follows if the distributions for the soft outputs are modeled as Gaussian:

$$L_e(C_i) = \log \frac{\sum_{s\in\chi_0^i} \frac{1}{\sigma(s,\overline{h})}\exp\left(-\frac{1}{2\sigma(s,\overline{h})^2}(E\{r|\hat{s},\overline{h}\}-E\{r|s,\overline{h}\})^2 - \sum_{j=1,j\neq i}^{m} L_a(C_j)\cdot c_j\right)}{\sum_{s\in\chi_1^i} \frac{1}{\sigma(s,\overline{h})}\exp\left(-\frac{1}{2\sigma(s,\overline{h})^2}(E\{r|\hat{s},\overline{h}\}-E\{r|\hat{s},\overline{h}\})^2 - \sum_{j=1,j\neq i}^{m} L_a(C_j)\cdot c_j\right)}$$

where $\overline{h}$ is the pattern stored in aggressor cells as defined above, and $\sigma(s,\overline{h})$ is the standard deviation of the distribution of the soft outputs for state s and pattern $\overline{h}$.

If the voltage distributions for all states and patterns have the same standard deviation $\sigma(s,\overline{h})=\sigma$, this equation can be simplified to the following expression:

$$L_e(C_i) = \log \frac{\sum_{s\in\chi_0^i} \exp\left(-\frac{1}{2\sigma^2}(E\{r|\hat{s},\overline{h}\}-E\{r|s,\overline{h}\})^2 - \sum_{j=1,j\neq i}^{m} L_a(C_j)\cdot c_j\right)}{\sum_{s\in\chi_1^i} \exp\left(-\frac{1}{2\sigma^2}(E\{r|\hat{s},\overline{h}\}-E\{r|s,\overline{h}\})^2 - \sum_{j=1,j\neq i}^{m} L_a(C_j)\cdot c_j\right)}$$

This equation can be further simplified to:

$$L_e(C_i) \approx \max_{s\in\chi_0^i}\left[-\frac{1}{2\sigma^2}(E\{r|\hat{s},\overline{h}\}-E\{r|s,\overline{h}\})^2 - \sum_{j=1,j\neq i}^{m} L_a(C_j)\cdot c_j\right] -$$

$$\max_{s \in \chi_1^i}\left[-\frac{1}{2\sigma^2}(E\{r \mid \hat{s}, \overline{h}\} - E\{r \mid s, \overline{h}\})^2 - \sum_{j=1, j \neq i}^{m} L_a(C_j) \cdot c_j\right]$$

Gaussian Approximation for Extrinsic LLRs Without Soft Decoder Feedback for Soft Outputs from Flash Memory

When no soft decoder feedback is used, the extrinsic LLRs can be computed as follows, using the Gaussian approximation for the soft output distributions when soft outputs from the flash memory are available:

$$L_e(C_i) = \log \frac{\sum_{s \in \chi_0^i} \frac{1}{\sigma(s)} \exp\left(-\frac{1}{2\sigma(s)^2}(r - E\{r \mid s\})^2\right)}{\sum_{s \in \chi_1^i} \frac{1}{\sigma(s)} \exp\left(-\frac{1}{2\sigma(s)^2}(r - E\{r \mid s\})^2\right)}.$$

If the voltage distributions for all states have the same standard deviation $\sigma(s)=\sigma$, this equation can be simplified to the following expression:

$$L_e(C_i) = \log \frac{\sum_{s \in \chi_0^i} \exp\left(-\frac{1}{2\sigma^2}(r - E\{r \mid s\})^2\right)}{\sum_{s \in \chi_1^i} \exp\left(-\frac{1}{2\sigma^2}(r - E\{r \mid s\})^2\right)}$$

This expression can be further simplified to:

$$L_e(C_i) \approx \max_{s \in \chi_0^i}\left[-\frac{1}{2\sigma^2}(r - E\{r \mid s\})^2\right] - \max_{s \in \chi_1^i}\left[-\frac{1}{2\sigma^2}(r - E\{r \mid s\})^2\right]$$

Gaussian Approximation for Extrinsic LLRs Without Soft Decoder Feedback for Hard Outputs from Flash Memory

When no soft decoder feedback is used, the extrinsic LLRs can be computed as follows, using the Gaussian approximation for the soft output distributions when only hard outputs from the flash memory are available:

$$L_e(C_i) = \log \frac{\sum_{s \in \chi_0^i} \frac{1}{\sigma(s)} \exp\left(-\frac{1}{2\sigma(s)^2}(E\{r \mid \hat{s}\} - E\{r \mid s\})^2\right)}{\sum_{s \in \chi_1^i} \frac{1}{\sigma(s)} \exp\left(-\frac{1}{2\sigma(s)^2}(E\{r \mid \hat{s}\} - E\{r \mid s\})^2\right)}.$$

If the voltage distributions for all states have the same standard deviation $\sigma(s)=\sigma$, this equation can be simplified to the following expression:

$$L_e(C_i) = \log \frac{\sum_{s \in \chi_0^i} \exp\left(-\frac{1}{2\sigma^2}(E\{r \mid \hat{s}\} - E\{r \mid s\})^2\right)}{\sum_{s \in \chi_1^i} \exp\left(-\frac{1}{2\sigma^2}(E\{r \mid \hat{s}\} - E\{r \mid s\})^2\right)}$$

This equation can be further simplified to:

$$L_e(C_i) \approx \max_{s \in \chi_0^i}\left[-\frac{1}{2\sigma^2}(E\{r \mid \hat{s}\} - E\{r \mid s\})^2\right] - \max_{s \in \chi_1^i}\left[-\frac{1}{2\sigma^2}(E\{r \mid \hat{s}\} - E\{r \mid s\})^2\right]$$

The corresponding pattern-dependent LLRs are computed as follows:

$$L_e(C_i) = \log \frac{\sum_{s \in \chi_0^i} \frac{1}{\sigma(s, \overline{h})} \exp\left(-\frac{1}{2\sigma(s, \overline{h})^2}(E\{r \mid \hat{s}, \overline{h}\} - E\{r \mid s, \overline{h}\})^2\right)}{\sum_{s \in \chi_1^i} \frac{1}{\sigma(s, \overline{h})} \exp\left(-\frac{1}{2\sigma(s, \overline{h})^2}(E\{r \mid \hat{s}, \overline{h}\} - E\{r \mid s, \overline{h}\})^2\right)}$$

If the voltage distributions for all states and patterns have the same standard deviation $\sigma(s,\overline{h})=\sigma$, this equation can be simplified to the following expression:

$$L_e(C_i) = \log \frac{\sum_{s \in \chi_0^i} \exp\left(-\frac{1}{2\sigma^2}(E\{r \mid \hat{s}, \overline{h}\} - E\{r \mid s, \overline{h}\})^2\right)}{\sum_{s \in \chi_1^i} \exp\left(-\frac{1}{2\sigma^2}(E\{r \mid \hat{s}, \overline{h}\} - E\{r \mid s, \overline{h}\})^2\right)}$$

This can be further simplified to:

$$L_e(C_i) \approx \max_{s \in \chi_0^i}\left[-\frac{1}{2\sigma^2}(E\{r \mid \hat{s}, \overline{h}\} - E\{r \mid s, \overline{h}\})^2\right] -$$

$$\max_{s \in \chi_1^i}\left[-\frac{1}{2\sigma^2}(E\{r \mid \hat{s}, \overline{h}\} - E\{r \mid s, \overline{h}\})^2\right]$$

Read Statistics Tables

FIGS. 17A through 17C are exemplary cell-based statistics tables that record statistics for reading out data from the flash memory. FIG. 17A is an exemplary cell-based statistics count table 1700 that indicates for a given pair of (written (s) and read (ŝ)) levels, the number of times the read level (ŝ) was read, when the write level (s) was written. For example, the read level (ŝ=00) was read 10617 times, when the write level (s) was also equal to 00. In addition, the read level (ŝ=00) was read in error 148 times, when the write level (s) was equal to 01. The count table 1700 also optionally indicates a sum of each row and column. The values in the count table 1700 are used by a number of cell-based statistics process, discussed below in conjunction with FIGS. 21, 23, 25 and 28.

FIG. 17B is an exemplary cell-based statistics table that indicates for a given pair of (written (s) and read (ŝ)) levels, the probability p(s|ŝ) that the write level (s) was written under the condition that the read level (ŝ) was read. FIG. 17C is an exemplary cell-based statistics table 1740 that indicates for a given pair of (written (s) and read (ŝ)) levels, the probability p(ŝ|s) that the read level (ŝ) was read, under the condition that the write level (s) was written.

FIG. 18 is an exemplary pattern-dependent cell-based statistics table 1800 that records pattern-dependent statistics for reading out data from the flash memory in the presence of a given pattern. The exemplary table 1800 indicates for a given pair of (written (s) and read (ŝ)) levels, in the presence of a given pattern, $\overline{h}$, the probability p(ŝ,$\overline{h}$|s) that the read level (ŝ)

was read in the presence of the pattern, h̄, under the condition that the write level (s) was written.

Collection of Statistics

Statistics Collection Using Reference Cells

Figure 19:
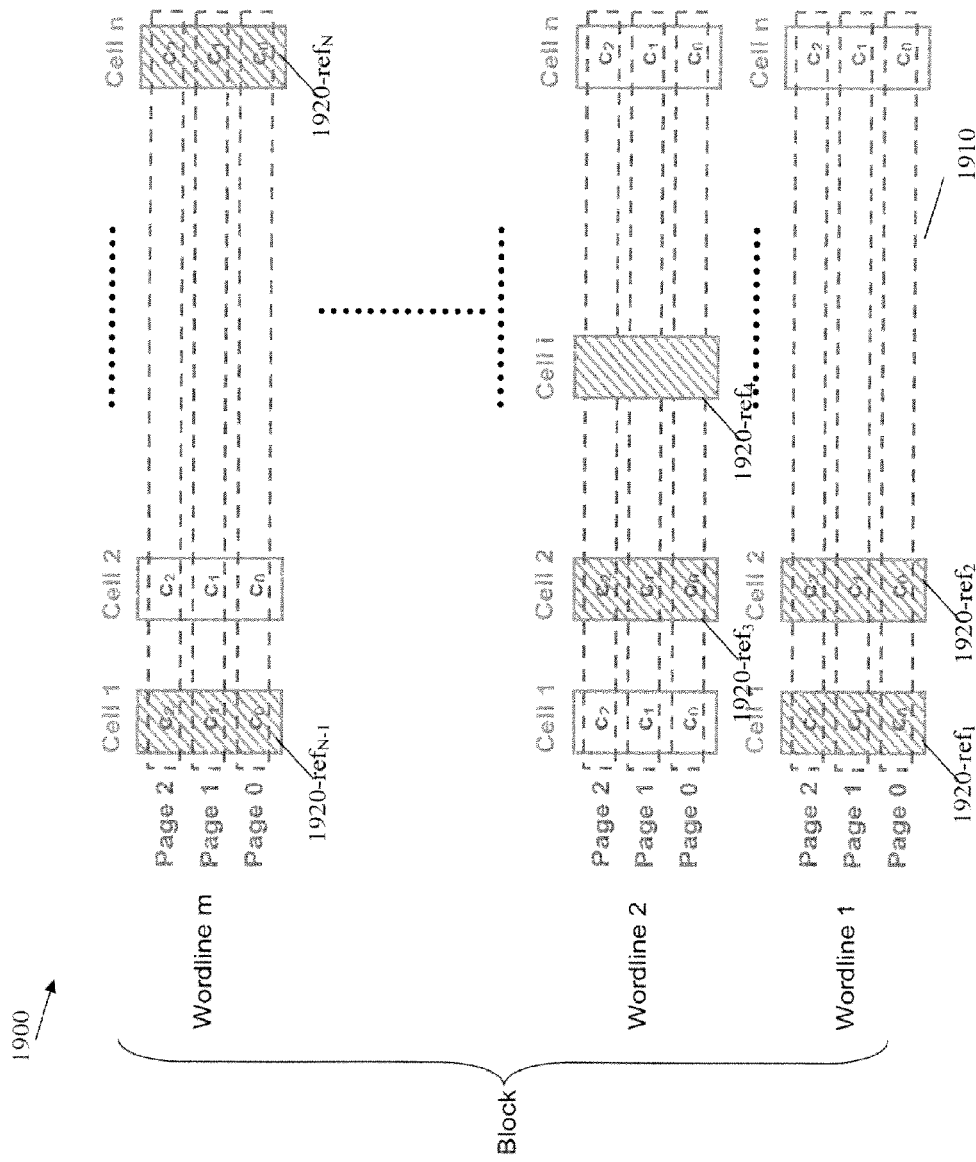
FIG. 19 illustrates the exemplary flash cell array of FIG. 3 in further detail for a reference cell embodiment of the present invention.

FIG. 19 illustrates the exemplary flash cell array of FIG. 3 in further detail. As shown in FIG. 19, the exemplary flash cell array 1900 comprises a plurality of reference cells 1920-ref$_1$ through 1920-ref$_N$ (collectively referred to herein as reference cells 1920) to provide reliable channel estimates or statistics in all operating conditions.

The exemplary reference cells 1920 are shown in FIG. 19 with a hashed background. The reference cells 1920 can be periodically or intermittently programmed using a known pattern, such as a known bit pattern or a known symbol pattern. It is noted that the reference cells 1920 can be spread among the flash cell array 1900 in any desired manner, for example, using a consistent or variable number of cells in each wordline. The location of the reference cells 1920 can be fixed or varied over time, for example, to avoid worn out or damaged cells. In one implementation, the location of the reference cells 1920 is fixed and the performance of the same reference cells 1920 can be observed over time. In this fixed location implementation, the reference cells 1920 can optionally be written only once, or written and read a comparable number of times as other cells in the flash memory array.

In a further variation, the location of the reference cells 1920 is varied over time in order that the performance of the reference cells 1920 reflects the performance of the entire array 1900. In yet another variation, the statistics can be obtained from reference cells 1920 in a number of different arrays 1900 and then the results are averaged.

As discussed further below, the reference cells 1920 are read and compared to the known pattern. For example, an estimate of the probability, $p_0$, of detecting an error can be obtained as follows:

$$p_0 = \frac{\text{\# of incorrect readouts}}{\text{\# of reference cells}}.$$

The programming and reading of reference cells can optionally be combined with wear-level algorithms that spread out the wear and tear across the memory, in a known manner.

In various embodiments, the reference cells 1920 can store all possible levels, can have a periodic pattern (where the levels alternate) and be either periodically written or read over time.

As discussed hereinafter, various embodiments of the present invention collect and employ bit-based statistics, cell-based or pattern-dependent statistics. For embodiments employing bit-based statistics, bit error performance is measured. For embodiments employing cell-based statistics, read statistics are measured on a cell basis. For pattern-dependent statistics, read statistics account also for the data pattern stored in aggressor cells.

1. Bit-Based Statistics Using Reference Cells

Figure 20:
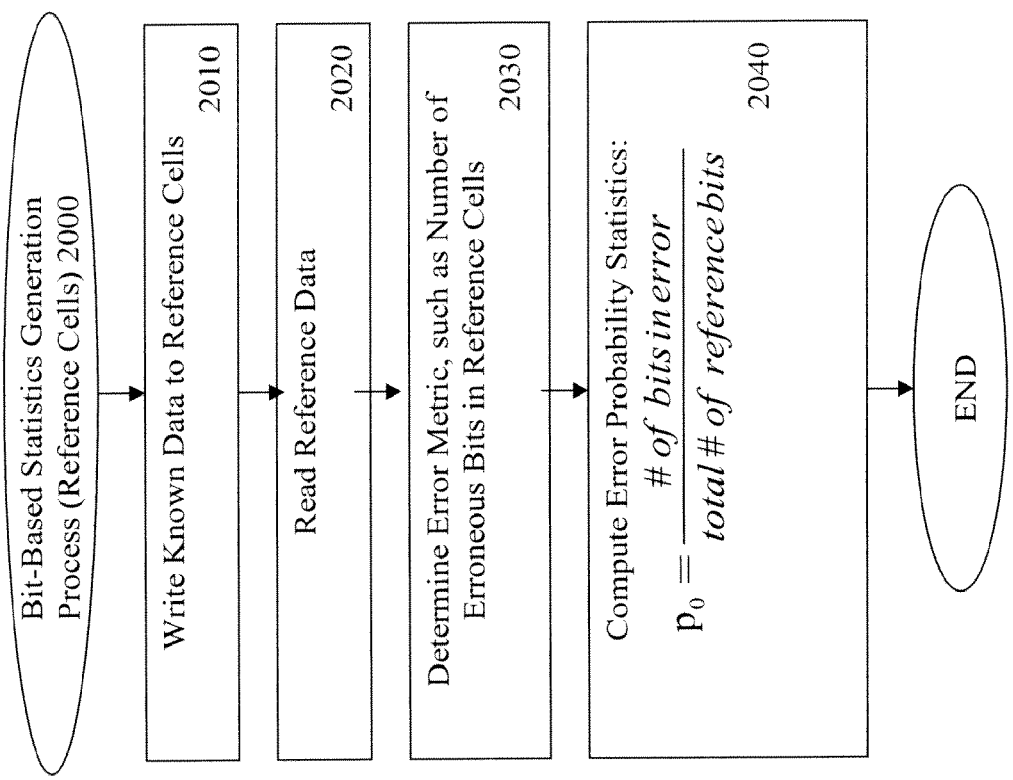
FIG. 20 is a flow chart describing an exemplary implementation of a bit-based statistics generation process for a reference cell embodiment of the present invention.

FIG. 20 is a flow chart describing an exemplary implementation of a bit-based statistics generation process 2000 for a reference cell embodiment of the present invention. Generally, the bit-based statistics generation process 2000 computes the probability, $p_0$, of detecting a bit error. The probability, $p_0$, of detecting an error can then be used by the LLR generator 1550 (FIG. 15) to compute the desired soft data. Initially, the statistics generation process 2000 writes a known pattern to one or more reference cells 1920 during step 2010. As previously indicated, the known pattern can be, for example, a known bit pattern or a known symbol pattern.

Thereafter, the reference cells are read during step 2020. The statistics generation process 2000 then determines an error metric, such as number of erroneous bits in the reference cells 1920, during step 2030. As previously indicated, the reference cells 1920 that were read during step 2020 can be compared to the known pattern.

The statistics generation process 2000 computes the error probability statistics during step 2040 as follows:

$$p_0 = \frac{\text{\# of bits in error}}{\text{total \# of reference bits}}$$

2. Cell-Based Statistics Using Reference Cells

Figure 21:
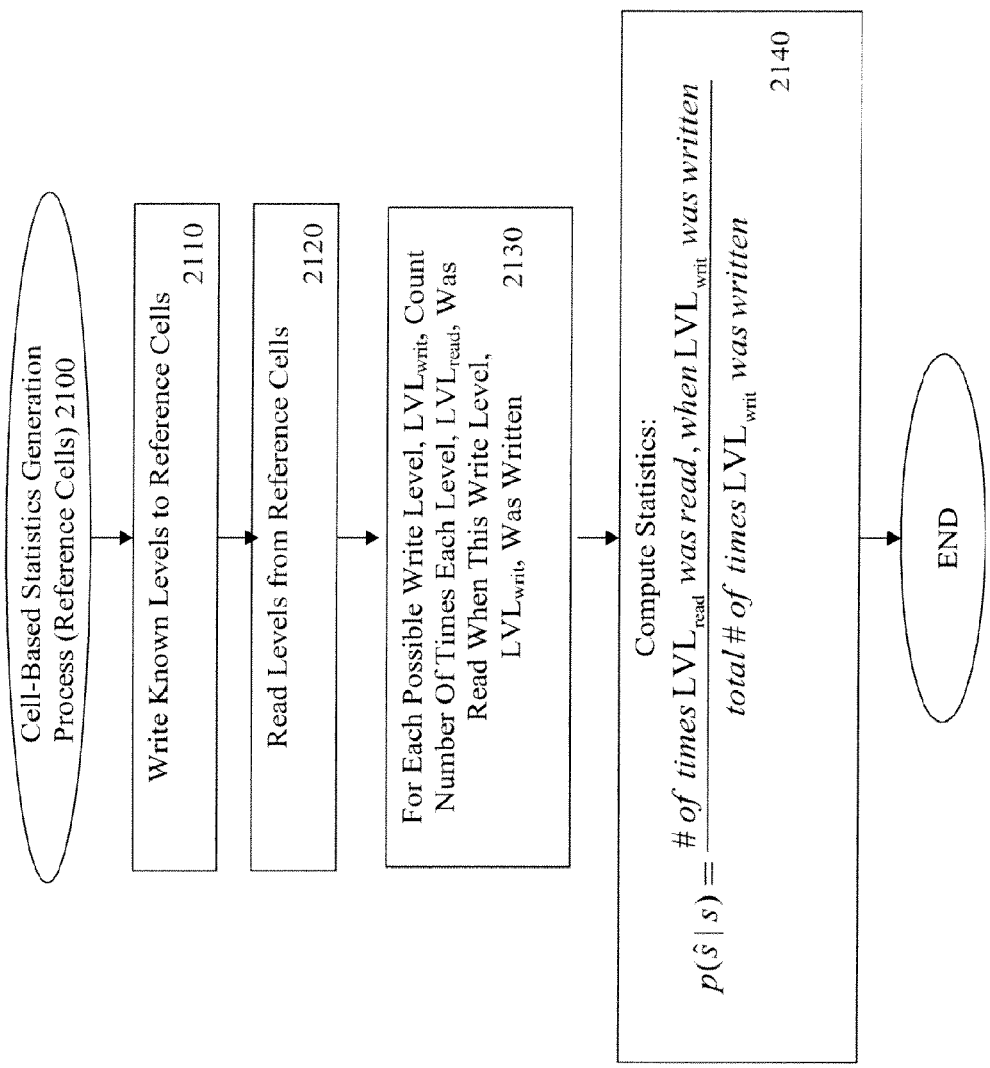
FIG. 21 is a flow chart describing an exemplary implementation of a cell-based statistics generation process for a reference cell embodiment of the present invention.

FIG. 21 is a flow chart describing an exemplary implementation of a cell-based statistics generation process 2100 for a reference cell embodiment of the present invention. As shown in FIG. 21, the cell-based statistics generation process 2100 initially writes one or more known voltage levels to the reference cells 1920 during step 2110.

Thereafter, the cell-based statistics generation process 2100 reads the voltage levels during step 2120 from the reference cells 1920. For each possible write level, s or $LVL_{writ}$, the cell-based statistics generation process 2100 counts during step 2130 the number of times each level, ŝ or $LVL_{read}$, was read when this write level, s or $LVL_{writ}$, was written.

The error probability statistics are computed during step 2140 as follows:

$$p(\hat{s} \mid s) = \frac{\text{\# of times } LVL_{read} \text{ was read, when } LVL_{writ} \text{ was written}}{\text{total \# of times } LVL_{writ} \text{ was written}}$$

where # denotes number.

Alternatively, the error probability statistics can be computed during step 2140 as follows (reverse case):

$$p(s \mid \hat{s}) = \frac{\text{\# of times } LVL_{writ} \text{ was written when } LVL_{read} \text{ was read}}{\text{total \# of times } LVL_{read} \text{ was read}}$$

It is noted that alternative normalization terms can be used in the denominator for the equations computed during step 2140.

Statistics Collection Using Decoded Codewords

In the decoded codeword embodiments of the present invention, soft data is generated for a memory device, such as a flash memory device 860, 960, using data obtained from decoded codewords as reference cells. Generally, hard data from a memory device, such as a flash memory device is decoded, and an error metric is obtained, such as a number of erroneous decoded bits. For example, the number of erroneous decoded bits can be obtained by comparing the decoded bits to the hard data obtained from the memory device. In this manner, the decoded codewords can be assumed to be correct and can serve as the reference cells discussed above.

1. Bit-Based Statistics Using Decoded Codewords

Figure 22:
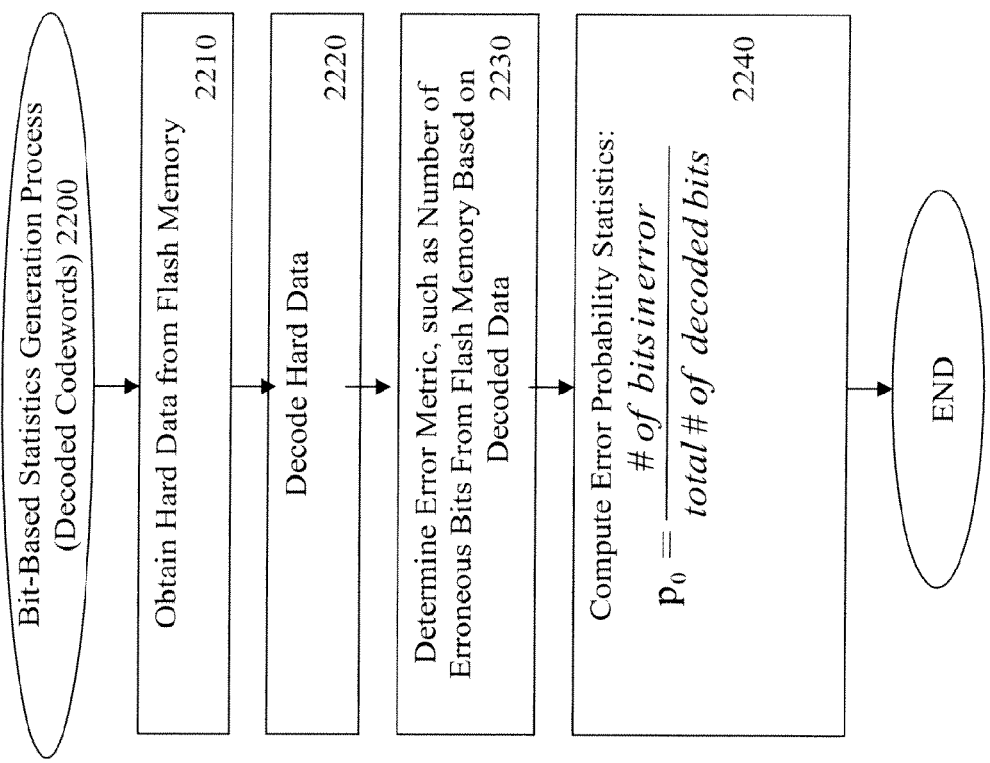
FIG. 22 is a flow chart describing an exemplary implementation of a bit-based statistics generation process for a decoded codeword embodiment of the present invention.

FIG. 22 is a flow chart describing an exemplary implementation of a bit-based statistics generation process 2200 for a decoded codeword embodiment of the present invention. Generally, the bit-based statistics generation process 2200 computes the probability, $p_0$, of detecting an error using decoded codewords. The probability, $p_0$, of detecting an error can then be used by the LLR generator 1550 (FIG. 15) to compute the desired soft data. Initially, the statistics generation process 2200 obtains hard data from the flash memory during step 2210.

Thereafter, the bit-based statistics generation process (decoded codewords) 2200 decodes the hard data during step 2220. An error metric, such as the number of erroneous bits from the flash memory is determined during step 2230. The number of erroneous bits can be determined, for example, by comparing the decoded bits (which are assumed to be correct) to the hard data from the flash memory.

The statistics generation process 2200 computes the error probability statistics during step 2240 as follows:

$$p_0 = \frac{\# \text{ of bits in error}}{\text{total } \# \text{ of decoded bits}}.$$

2. Cell-Based Statistics Using Decoded Codewords

Figure 23:
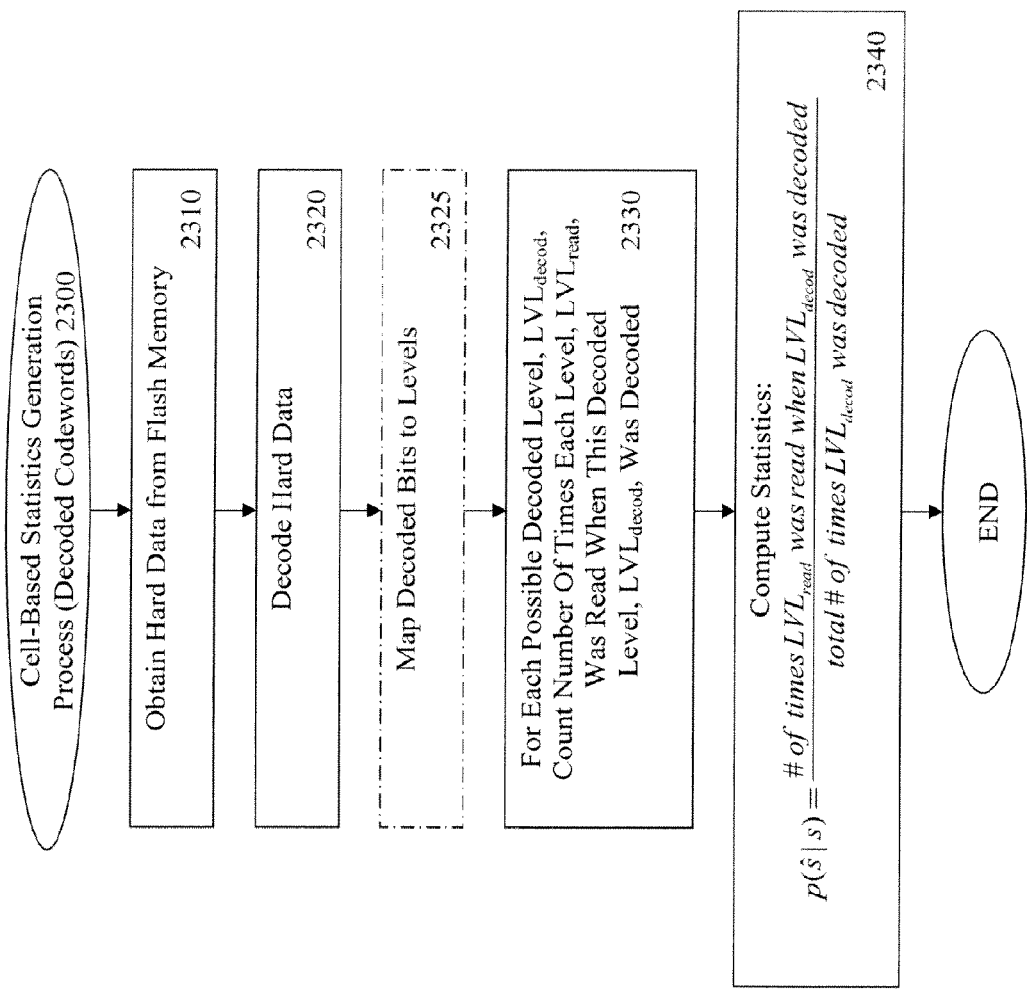
FIG. 23 is a flow chart describing an exemplary implementation of a cell-based statistics generation process for a decoded codeword embodiment of the present invention.

FIG. 23 is a flow chart describing an exemplary implementation of the cell-based statistics generation process (decoded codewords) 2300 incorporating features of the present invention. Generally, the statistics generation process 2300 computes cell-based error probabilities using decoded codewords. Initially, the cell-based statistics generation process 2300 obtains hard data from the flash memory during step 2310.

Thereafter, the cell-based statistics generation process (decoded codewords) 2300 decodes the hard data during step 2320. The decoded bits are then mapped to the corresponding voltage levels during step 2325.

For each possible decoded voltage level, s or $LVL_{decod}$, the cell-based statistics generation process (decoded codewords) 2300 then counts during step 2330 the number of times each voltage level, ŝ or $LVL_{read}$, was read when this decoded level, s $LVL_{decod}$, was decoded.

The error probability statistics are computed during step 2340 as follows:

$$p(\hat{s} \mid s) = \frac{\# \text{ of times } LVL_{read} \text{ was read when } LVL_{decod} \text{ was decoded}}{\text{total } \# \text{ of times } LVL_{decod} \text{ was decoded}}$$

Alternatively, the error probability statistics can be computed during step 2340 as follows (reverse case):

$$p(s \mid \hat{s}) = \frac{\# \text{ of times } LVL_{decod} \text{ was decoded when } LVL_{read} \text{ was read}}{\text{total } \# \text{ of times } LVL_{read} \text{ was read}}$$

Condition-Specific Error Probabilities

As previously indicated, the error probability statistics can optionally be obtained for different conditions, such as for different locations of the memory array, for different patterns of aggressor cells, for different temperatures, for different number of program/erase or read cycles, etc. Thereafter, when the same conditions are observed, the soft data can be obtained using the proper condition-dependent statistics or probabilities.

As discussed below in conjunction with FIGS. 24 and 25, exemplary location-specific statistics generation processes 2400, 2500 obtain the error probability statistics for different locations of the memory array, using bit-based statistics and cell-based statistics, respectively.

Bit-Based Location-Specific Statistics

Figure 24:
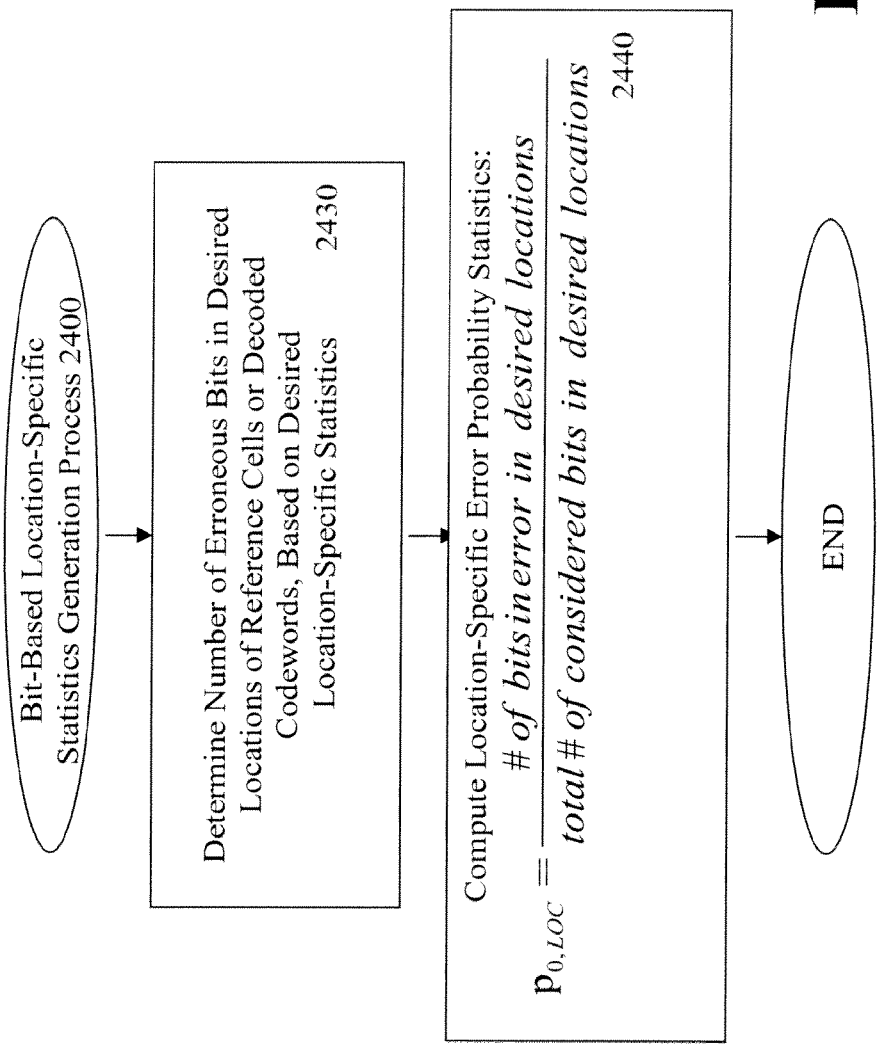
FIG. 24 is a flow chart describing an exemplary bit-based location-specific statistics generation process that computes error probability statistics for a number of different locations in the memory array.

FIG. 24 is a flow chart describing an exemplary bit-based location-specific statistics generation process 2400 that estimates the probability of detecting bit errors for a number of different locations in the memory array. For example, the probability, $p_{0, LOC}$, of detecting an error can be obtained for one or more of different page locations, wordline locations, bitline locations (such as even and odd bitlines) and different bits within a multi-level cell (such as most significant bits (MSBs) and least significant bits (LSBs)). As shown in FIG. 24, the exemplary bit-based location-specific statistics generation process 2400 initially determines the number of erroneous bits in the desired locations of reference cells or decoded codewords during step 2430, based on the desired location-specific statistics. For example, if the location-specific statistic is for MSBs, then the number of erroneous MSB bits is evaluated during step 2430. It is noted that when MSB statistics are being obtained, for example, any other bits in each cell, such as LSB bits, can optionally be ignored.

The location-specific statistics generation process 2400 then computes the location-specific error probability statistics during step 2440, as follows:

$$p_{0,LOC} = \frac{\# \text{ of bits in error in desired location}}{\text{total } \# \text{ of considered bits in desired location}}.$$

Cell-Based Location-Specific Statistics

For a cell-based location-specific implementation, the different locations of interest in the memory array may comprise, for example, one or more of different wordline locations or bitline locations (such as even and odd bitlines).

Figure 25:
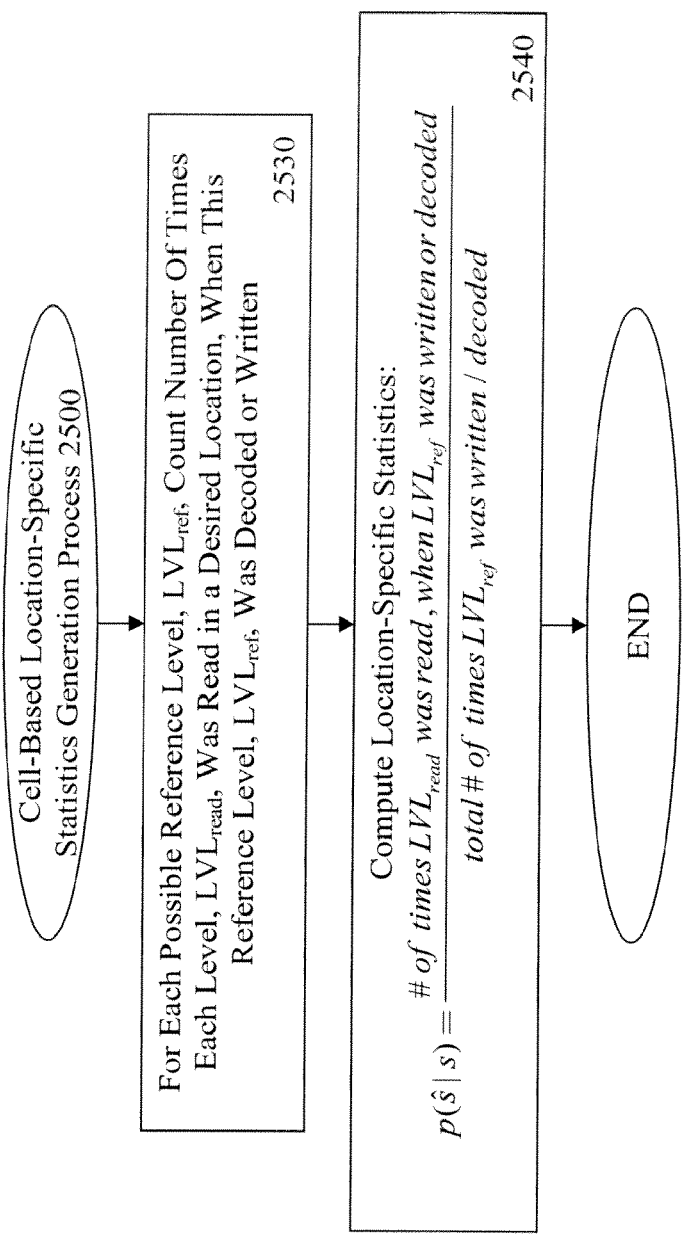
FIG. 25 is a flow chart describing an exemplary cell-based location-specific statistics generation process that computes statistics for a number of different locations in the memory array.

FIG. 25 is a flow chart describing an exemplary cell-based location-specific statistics generation process 2500 that obtains the error probability statistics for a number of different locations in the memory array 1900, such as one or more of different wordline locations or bitline locations (such as even and odd bitlines). As shown in FIG. 25, for each possible reference voltage level, s or $LVL_{ref}$, the exemplary cell-based location-specific statistics generation process 2500 initially counts during step 2530 the number of times each voltage level, ŝ $LVL_{read}$, was read in a desired location, when this reference level, s or $LVL_{ref}$, was decoded or written.

The cell-based location-specific statistics generation process 2500 then computes the location-specific error probability statistics during step 2540, as follows:

$$p(\hat{s} \mid s) = \frac{\# \text{ of times } LVL_{read} \text{ was read,} \atop \text{when } LVL_{ref} \text{ was written or decoded}}{\text{total } \# \text{ of times } LVL_{ref} \text{ was written/decoded}}$$

Alternatively, $p(s|\bar{s})$ can be computed as discussed above.

In various implementations of the present invention, separate bit-based, cell-based or pattern-based statistics can be collected for each page, wordline or memory array, or for groups of pages, wordline or memory arrays (such as for the different page levels within a wordline, or for bottom, middle and top wordlines in a memory array). In addition, statistics can be averaged over multiple pages, wordlines or memory arrays and then the average statistics can be used for these pages, wordlines or memory arrays.

Pattern-Dependent Statistics

As previously indicated, various embodiments of the present invention compute extrinsic LLRs, $L_e$, for one or more soft values, r, for a target cell and one or more values, h̄, for the aggressor cell(s), where h̄ is the data pattern stored in aggressor cells (such as surrounding cell(s)).

Figure 26:
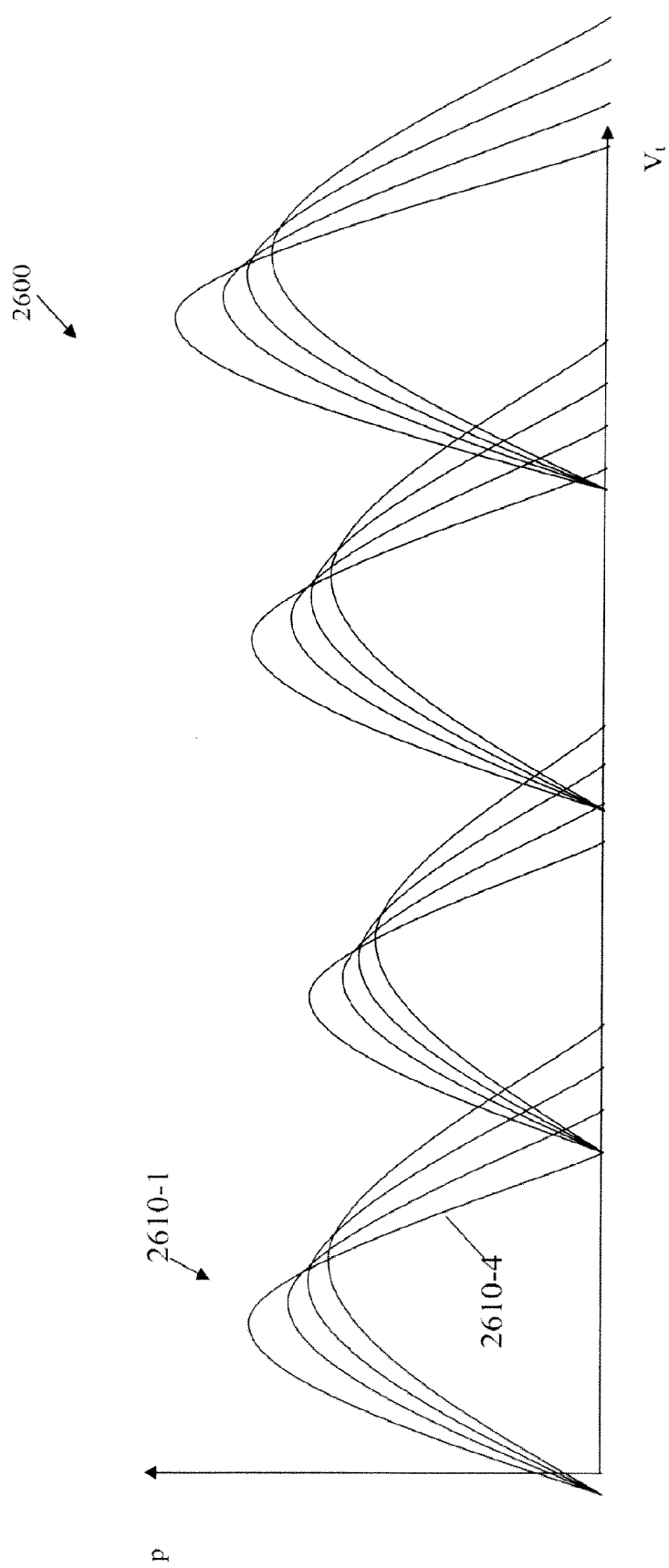
FIG. 26 illustrates a collection of probability density functions that indicate the pattern-dependent disturbance effects on a given target cell, based on all the possible values of each aggressor cell.

FIG. 26 illustrates an exemplary collection 2600 of probability density functions 2610 for a given target cell 710 of an exemplary multi-level cell flash memory 600, based on all the possible values of each aggressor cell 720. The exemplary multi-level cell flash memory has four levels per cell (two bits), and one aggressor cell 720 is considered for the data-dependent pdfs. The number of probability density functions applicable to each possible level of a given target cell 710 is the number of possible levels for each aggressor cell 720 raised to the number of aggressor cells 720 that affect a given target cell 710. As previously indicated, in the exemplary embodiment, each cell can have one of four possible values, there is one aggressor cell 720 per target cell 710 and each aggressor cell 720 can have one of four possible levels. Thus, for illustration, the collection 2600 of probability density functions comprises four probability density functions 2610-1 through 2610-4 for data or voltage level 0, attributable to a pattern of the aggressor cells. There are also four probability density functions for each of the other data levels 1, 2 and 3. The present invention can be extended to multi-level cell flash memories 600 having an arbitrary number of levels per cell, and an arbitrary number of aggressor cells 720, as would be apparent to a person of ordinary skill in the art.

Generally, each probability density function in FIG. 26 expresses, among other noise and disturbance effects, the ICI effect on a given target cell 710 for a given value of a corresponding aggressor cell 720. In a further embodiment of the invention, the data-dependent probability density functions can express other data-dependent distortion instead of ICI or in addition to ICI. As discussed hereinafter, in various embodiments, the probability density functions can be pre-defined and static, adapted based on real-time observations, or expressed as a function of the measured or detected value, h, for the aggressor cell 720, such as a Gaussian function.

According to one aspect of the invention, disturbance in a flash memory device can be characterized by obtaining one or more probability density functions that express pattern-dependent disturbance of one or more aggressor cells on at least one target cell. The disturbance may comprise, for example, back pattern dependency, intercell interference, to program disturb, read disturb and/or additional noise. The probability density function can be updated based on one or more data decisions. The probability density function can be represented as a stored table and/or an expression.

It is further noted that the table entries or function parameters of the probability density functions may optionally be adaptively updated, e.g., based on received data decisions. For example, a probability density function is selected based on a received aggressor pattern, h̄. The selected probability density function is then updated (e.g., by increasing a corresponding counter) with the latest occurrence, based on the received target cell value, r, using known techniques.

As previously indicated, the number of aggressor cells 720 that influence a given target cell 710 can be reduced or neglected based on a number of factors. In this manner, the number of probability density functions that need to be considered can be reduced. For example, in an exemplary implementation that mitigates ICI, if the diagonal coupling coefficients, $k_{xy}$, are much smaller than other coupling coefficients (as is often the case), the ICI from the diagonally positioned cells can be neglected. In addition, the programming sequence influences the number of aggressor cells 720 that need to be considered. For example, if wordlines are always written in a fixed order, such as a bottom up approach, then there may be no disturbance ICI contribution from cells in a lower wordline. In addition, if the disturbance ICI is symmetric with respect to left and right neighbors of a target cell 710, the number of probability density functions that need to be characterized is reduced by half.

As previously indicated, in one exemplary implementation, the probability density functions can be approximated using Gaussian probability density functions. In further variations, improved performance can be obtained at the expense of additional complexity, if the probability density functions are based on, for example, histograms. When the probability density functions are implemented using histograms, the probability density functions can be adaptively updated using successfully decoded wordlines to train the histograms.

In a further embodiment, the probability density functions and approximation thereof can be used by trellis-based detection algorithms, such as Viterbi, Soft Output Viterbi (SOVA) and BCJR algorithms to detect the read data.

1. Bit-Based Pattern-Dependent Statistics

Figure 27:
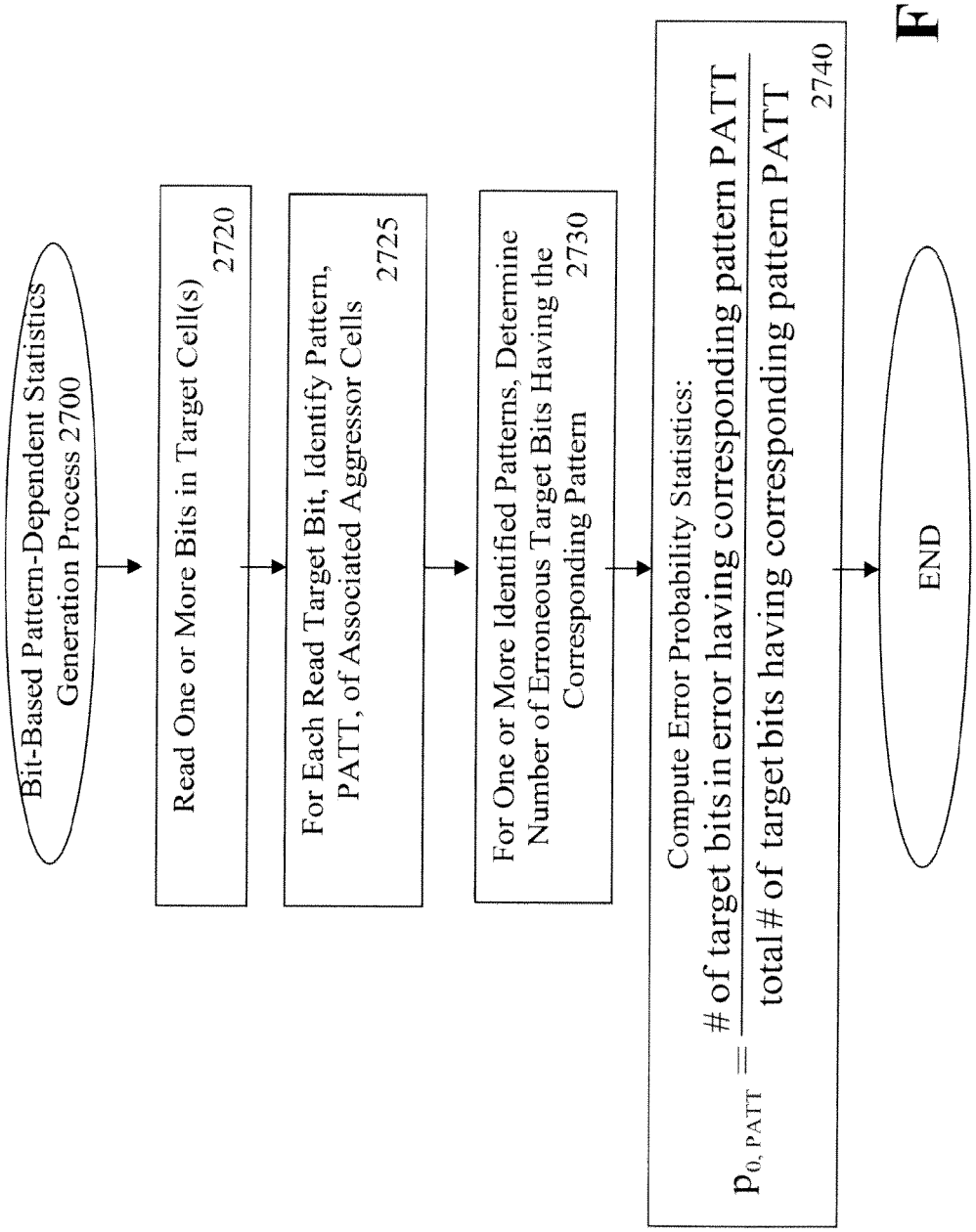
FIG. 27 is a flow chart describing an exemplary bit-based pattern-dependent statistics generation process that estimates the error probability statistics dependent on a given data pattern in one or more aggressor cells associated with at least one target cell.

FIG. 27 is a flow chart describing an exemplary bit-based pattern-dependent statistics generation process 2700 that estimates the probability, $p_0$, PATT, of detecting a bit error for a given pattern, h̄ or PATT, of one or more aggressor cells 720 associated with at least one target cell 710 (FIG. 7). Initially, the bit-based pattern-dependent statistics generation process 2700 reads the reference target cells 710 and potentially the associated aggressor cell(s) 720 during step 2720. In addition, for each read target bit, the pattern, PATT, of associated aggressor cells 720 is identified during step 2725. The pattern can be identified during step 2725, for example, by evaluating the known pattern that was written or based on an actual read operation of reference cells or decoded codewords.

For one or more identified patterns, the number of erroneous target bits having the corresponding pattern is determined during step 2730. The error probability statistics are then computed during step 2740, as follows:

$$p_{0,PATT} = \frac{\text{\# of target bits in error having corresponding pattern } PATT}{\text{total \# of target bits having corresponding pattern } PATT}$$

It is noted that the above-described techniques can optionally be integrated to obtain location-specific, pattern-dependent statistics, as would be apparent to a person of ordinary skill in the art. In addition, in further variations, the read statistics can also or alternatively be obtained as a function of the endurance, read cycles, retention, temperature or other parameters of the memory device.

2. Cell-Based Pattern-Dependent Statistics

Figure 28:
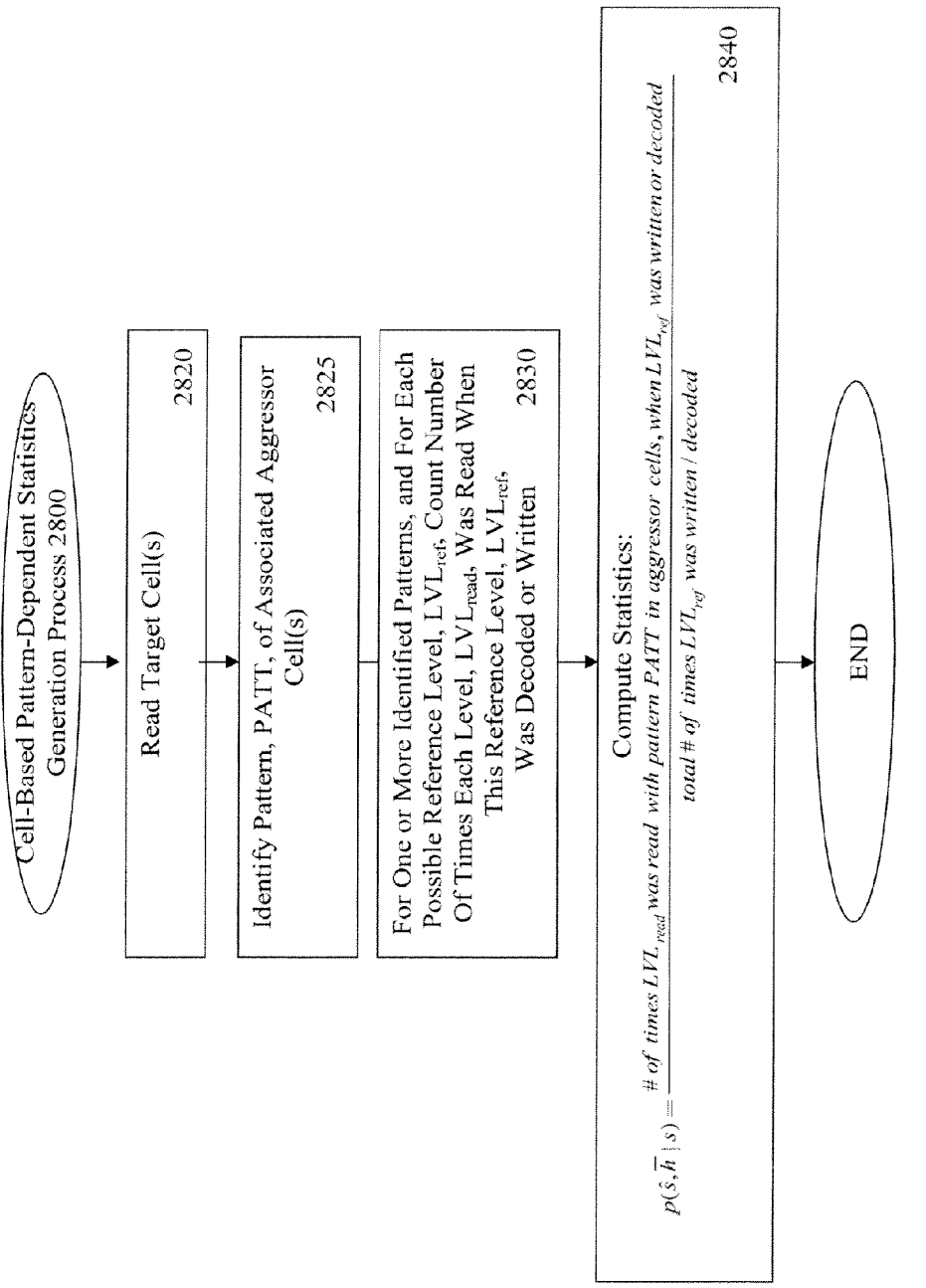
FIG. 28 is a flow chart describing an exemplary cell-based pattern-dependent statistics generation process that estimates the statistics dependent on a given data pattern in one or more aggressor cells associated with at least one target cell.

FIG. 28 is a flow chart describing an exemplary cell-based pattern-dependent statistics generation process 2800 that estimates the probability of detecting errors for a given pattern of one or more aggressor cells associated with at least one target cell. As shown in FIG. 28, the cell-based pattern-dependent statistics generation process 2800 initially reads one or more target cell(s) during step 2820. Thereafter, the pattern, h̄ or PATT, of the associated aggressor cell(s) is identified during step 2825.

Thereafter, for one or more identified patterns, and for each possible reference voltage level, s or $LVL_{ref}$, the cell-based pattern-dependent statistics generation process 2800 counts during step 2830 the number of times each voltage level, $\hat{S}$ or $LVL_{read}$, was read when this reference level, s or $LVL_{ref}$, was decoded or written.

The pattern-dependent error probability statistics are computed during step 2840 as follows:

$$p(\hat{s}, h \mid s) = \frac{\text{\# of times } LVL_{read} \text{ was read with pattern } PATT \text{ in aggressor cells, when } LVL_{ref} \text{ was written or decoded}}{\text{total \# of times } LVL_{ref} \text{ was written/decoded}}$$

Asymmetric Error Probability Statistics

Figure 29:
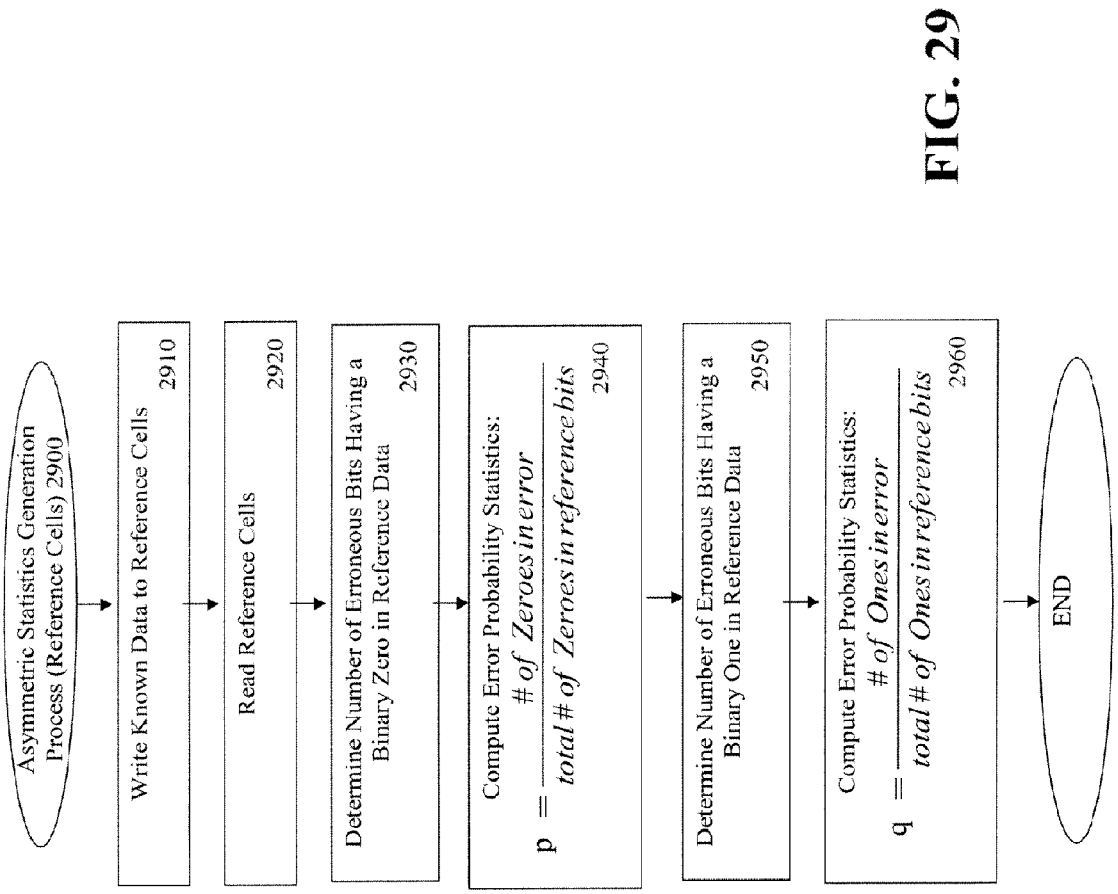
FIG. 29 is a flow chart describing an exemplary asymmetric statistics generation process that estimates the error probability statistics for two possible binary values for a reference cell embodiment of the present invention.
Figure 30:
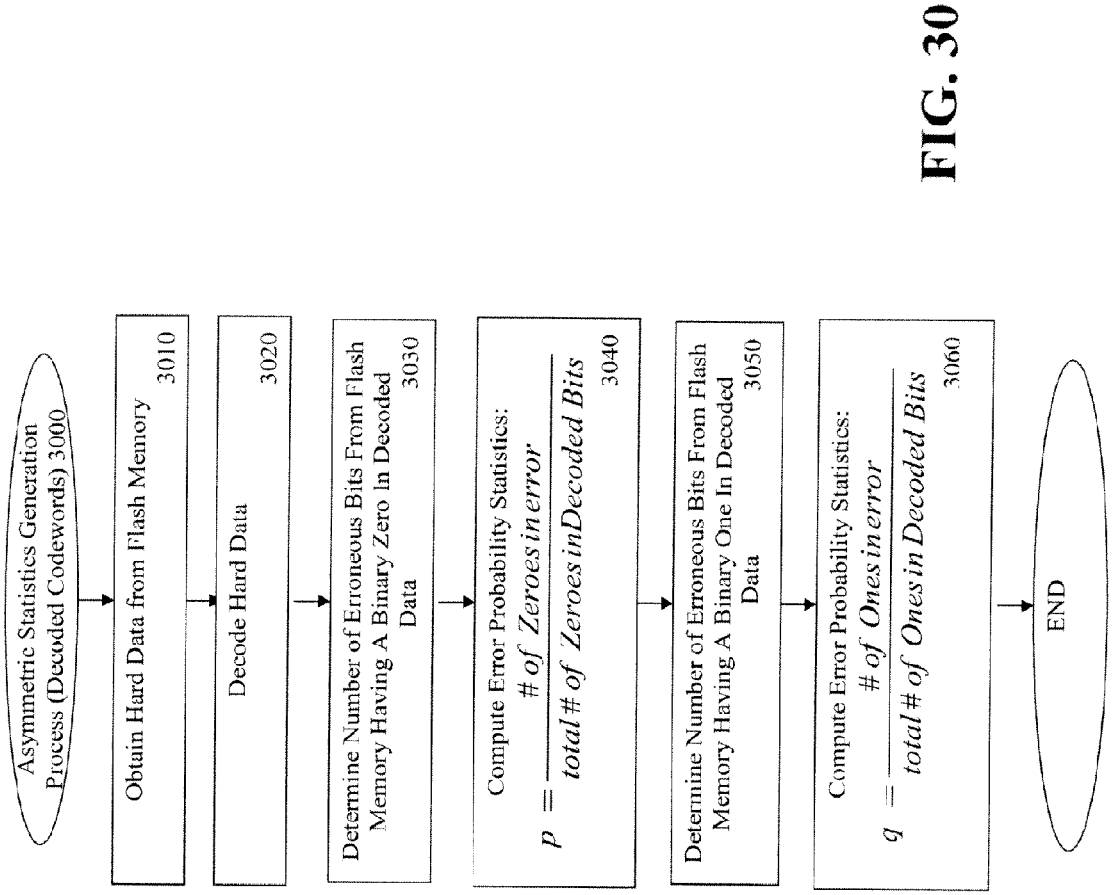
FIG. 30 is a flow chart describing an exemplary asymmetric statistics generation process that estimates the error probability statistics for two possible binary values for a decoded codeword embodiment of the present invention.

As previously indicated, in certain channels, such as NAND flash memory channels, the probability of detecting an error for different possible binary values, such as binary zero and binary one, can differ significantly. Thus, the present invention optionally provides the probability of detecting an error for asymmetric channels. FIGS. 29 and 30 provide exemplary asymmetric statistics generation processes 2900, 3000 that estimate the error probabilities, p and q, for two possible binary values, such as binary one and binary zero. As discussed further below, FIG. 29 estimates the asymmetric statistics using reference cells, while FIG. 30 estimates the asymmetric statistics using decoded codewords. The present invention thus provides asymmetric LLRs for each possible binary value based on the hard data from the flash memory.

Asymmetric Error Probabilities—Reference Cells

As previously indicated, in certain channels, such as NAND flash memory channels, the probability of detecting an error for different possible binary values, such as binary zero and binary one, can differ significantly. Thus, the present invention optionally provides the probability of detecting an error for asymmetric channels. FIG. 29 is a flow chart describing an exemplary asymmetric statistics generation process 2900 that estimates the error probabilities for two possible binary values for a reference cell embodiment of the present invention.

As shown in FIG. 29, the asymmetric statistics generation process 2900 initially writes a known pattern to the reference cells 1920 during step 2910 and then reads the reference cells 1920 during step 2020. The asymmetric statistics generation process 2900 determines the number of erroneous bits having a binary zero in the reference data during step 2930, and then computes the error probability statistics for binary zero during step 2940, as follows:

$$p = \frac{\text{\# of Zeroes in error}}{\text{total \# of Zeros in reference bits}}.$$

Thereafter, the asymmetric statistics generation process 2900 determines the number of erroneous bits having a binary one in the reference data during step 2950, and then computes the error probability statistics for binary one during step 2960, as follows:

$$q = \frac{\text{\# of Ones in error}}{\text{total \# of Ones in reference bits}}.$$

Asymmetric Error Probabilities—Decoded Codewords

FIG. 30 is a flow chart describing an exemplary asymmetric statistics generation process 3000 that estimates the error probabilities for two possible binary values for a decoded codeword embodiment of the present invention. As shown in FIG. 30, the asymmetric statistics generation process 3000 initially obtains the hard data from the flash memory during step 3010 and decodes the hard data during step 3020.

The asymmetric statistics generation process 3000 then determines the number of erroneous bits from the flash memory that have a binary zero in the decoded data during step 3030. The error probability statistics for binary zero are then computed during step 3040, as follows:

$$p = \frac{\text{\# of Zeroes in error}}{\text{total \# of Zeroes } inDecoded \text{ Bits}}.$$

Similarly, the number of erroneous bits from the flash memory that have a binary one in the decoded data is then determined during step 3050. The error probability statistics for binary one are then computed during step 3060, as follows:

$$q = \frac{\text{\# of Ones in error}}{\text{total \# of Ones in Decoded Bits}}.$$

In one embodiment, the statistics can be collected, computed and stored while the NAND flash memory is idle (i.e., not actively reading or writing user data).

While the exemplary embodiments have employed statistics collection using reference cells or decoder feedback, adaptive methods can also be employed to estimate statistics using detected or decoded data, for example, using a minimum mean square error criterion.

In an alternative embodiment, statistics or corresponding LLRs can be precomputed for worst-case operating condition (in terms of the number of, for example, the program/erase cycles, retention time and temperature), for example, based on experimental characterization of flash memories and then use them for bad channel conditions. In this manner, more accurate statistics or LLRs are available when the error probability is the highest. In other words, pre-defined statistics or corresponding LLRs can be precomputed for predefined operating conditions.

In a further variation, soft data can be iteratively generated based on different statistics (such as error probabilities) until decoding is successful. The statistics can be varied over a range until successful detection or decoding of the data. This variation of the invention provides a virtual reread of the data. Although the data is not actually reread from the flash memory, the data is decoded successfully with different soft information.

Error Performance Based on Unsatisfied Parity Checks

Aspects of the present invention recognize that unsatisfied parity checks can also be employed as a performance metric to obtain soft data. Consider a (N,K,J,L) LDPC code where N is codeword length, K is the uncoded codeword length (user data length in a codeword), and J and L are column and row weights of the parity check matrix respectively. When the (N,K,J,L) LDPC codeword is transmitted or stored with an error probability $p_0$, the probability that a check sum fails in the first iteration can be expressed as follows:

$$p_c = \frac{1 - (1 - 2p_0)^L}{2}.$$

This probability can be estimated as follows:

$$p_c = \frac{\text{\# of unsatisfied checks in first iteration}}{N - K}.$$

Thus, the error probability, $p_0$, can be estimated as follows:

$$p_0 = \frac{1 - \sqrt[L]{1 - 2p_c}}{2} \approx \frac{p_c}{L}.$$

In the above procedure, the channel and initial LLR values can be estimated before performing iterative decoding. The channel estimation complexity and latency are less than that of one iteration of soft-decision decoding with a significant performance gain over hard decision decoding of LDPC codes. The additional hardware compared to a standard implementation of soft-decision decoding is a block that performs the following computation:

$$p_c \approx \frac{\text{\# of unsatisfied checks in first iteration}}{L(N - K)}.$$

Figure 31:
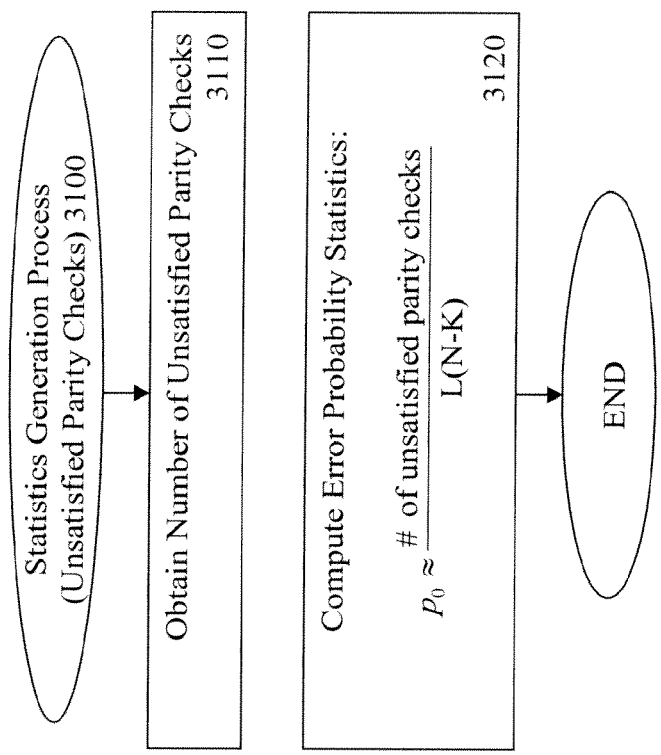
FIG. 31 is a flow chart describing an exemplary implementation of a statistics generation process using unsatisfied parity checks.

FIG. 31 is a flow chart describing an exemplary implementation of a statistics generation process 3100 using unsatisfied parity checks in accordance with one aspect of the present invention. In one embodiment, the unsatisfied parity checks after the first iteration are employed. Generally, the statistics generation process 3100 computes the probability, $p_0$, of detecting an error using unsatisfied parity checks. The probability, $p_0$, of detecting an error can then be used by the LLR generator 1550 (FIG. 15) to compute the desired soft data.

Initially, the statistics generation process 3100 obtains the number of unsatisfied parity checks during step 3110. The statistics generation process 3100 then computes the error probability statistics during step 3120 as follows:

$$p_0 \approx \frac{\text{\# of unsatisfied checks}}{L(N - K)}.$$

Location-Specific Statistics—Unsatisfied Parity Checks

Figure 32:
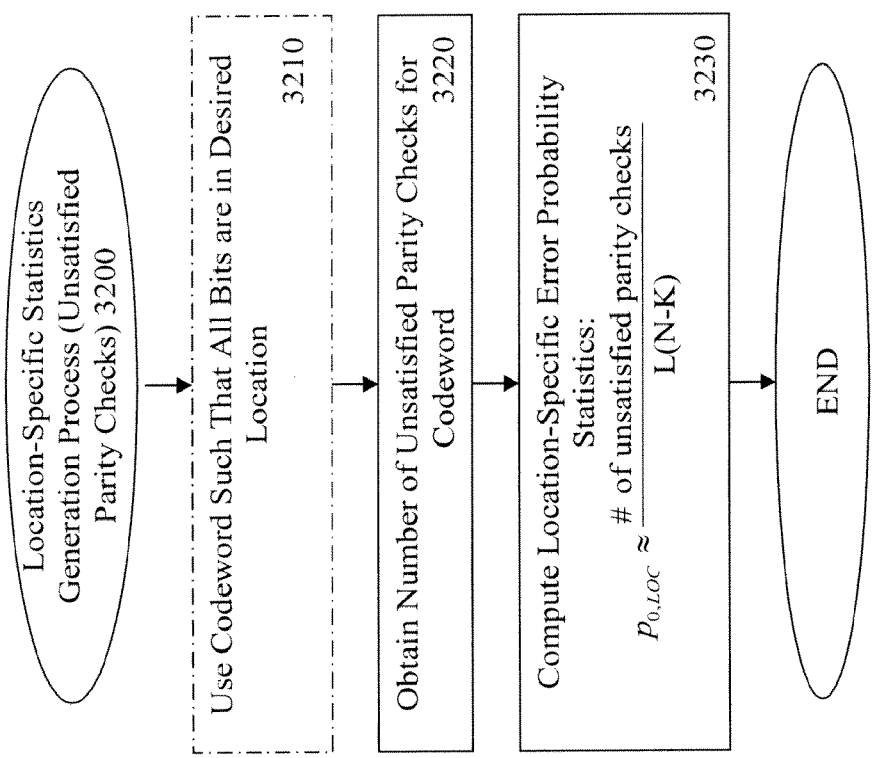
FIG. 32 is a flow chart describing an exemplary location-specific statistics generation process that estimates the error probability statistics for a number of different locations in the memory array using unsatisfied parity checks.

FIG. 32 is a flow chart describing an exemplary location-specific statistics generation process 3200 that obtains the error probability statistics for a number of different locations in the memory array 1900 using unsatisfied parity checks. For example, the error probability statistics can be obtained for one or more of different page locations, wordline locations, bitline locations (such as even and odd bitlines) and different bits within a multi-level cell (such as most significant bits (MSBs) and least significant bits (LSBs)). Generally, location-specific statistics are obtained using unsatisfied parity checks by using codewords that position bits in the desired locations (step 3210).

As shown in FIG. 32, the exemplary location-specific statistics generation process 3200 then obtains the number of unsatisfied parity checks for a codeword during step 3220. Thereafter, the location-specific error probability statistics are computed during step 3230, as follows:

$$p_{0,LOC} \approx \frac{\text{\# of unsatisfied checks}}{L(N - K)}.$$

Asymmetric Statistics Based on Unsatisfied Parity Checks

Figure 33:
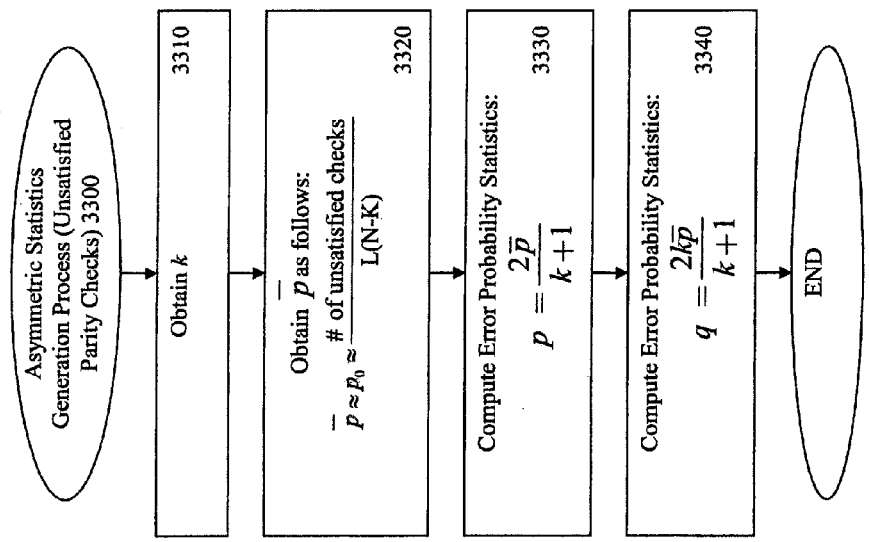
FIG. 33 is a flow chart describing an exemplary asymmetric statistics generation process that estimates the error probability statistics for two possible binary values using unsatisfied parity checks.

FIG. 33 is a flow chart describing an exemplary asymmetric statistics generation process 3300 that estimates the probabilities of detecting an error for two possible binary values using unsatisfied parity checks. This aspect of the present invention recognizes that the average error probability, $\bar{p}$, can be computed based on unsatisfied parity checks $$\left(\text{where } \bar{p} = \frac{p + q}{2}\right).$$

The values for p and q can be computed based on the average error probability, $\bar{p}$, and a ratio k of error probabilities, p and q.

The ratio k of error probabilities, p and q, can be obtained using data analysis, such as the decoded codewords techniques described above. Alternatively, the ratio k of error probabilities, p and q, can be obtained, for example, using the reference cell techniques described in International Patent Application entitled "Methods and Apparatus for Soft Data Generation for memory devices Using Reference Cells," filed contemporaneously herewith and incorporated by reference herein. The ratio k of error probabilities, p and q, would typically be computed offline and stored, for example, in a table. As shown in FIG. 33, the exemplary asymmetric statistics generation process (unsatisfied parity checks) 3300 initially obtains ratio k of error probabilities, p and q, during step 3310.

The average error probability probability, $\bar{p}$, can be obtained during step 3320 using the techniques described above in conjunction with FIG. 16. In particular, the average error probability, $\bar{p}$, can be estimated as follows:

$$\bar{p} \approx p_0 \approx \frac{\text{\# of unsatisfied checks}}{L(N - K)}.$$

Thereafter, the error probability statistics, p, for binary zero are computed during step 3330, as follows:

$$p = \frac{2\bar{p}}{k + 1}.$$

Thereafter, the error probability statistics, q, for binary one are computed during step 3340, as follows:

$$q = \frac{2k\bar{p}}{k + 1}.$$

It is noted that the error probability statistics, p and q, computed by the asymmetric statistics generation process (unsatisfied parity checks) 3300 can optionally be location-specific and/or pattern-dependent.

Process, System and Article of Manufacture Details

While a number of flow charts herein describe an exemplary sequence of steps, it is also an embodiment of the present invention that the sequence may be varied. Various permutations of the algorithm are contemplated as alternate embodiments of the invention. While exemplary embodiments of the present invention have been described with respect to processing steps in a software program, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a recordable medium (e.g., floppy disks, hard drives, compact disks, memory cards, semiconductor devices, chips, application specific integrated circuits (ASICs)) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The computer systems and servers described herein each contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network.

It is to be understood that the embodiments and variations shown and described herein are merely illustrative of the principles of this invention and that various modifications may be implemented by those skilled in the art without departing from the scope and spirit of the invention.

We claim:

1. A method for generating at least one soft data value in a memory device, comprising:

writing known data to one or more reference cells in said memory device, wherein said memory device comprises a plurality of cells and wherein at least a portion of said plurality of cells are used as said reference cells;

reading one or more of said reference cells at least some of which have the known data written thereto;

obtaining a read statistic for generating said at least one soft data value for soft decoding of data, wherein said read statistic is based on said read one or more reference cells, wherein said read statistic is obtained based on one or more bits read from said one or more reference cells having said known data written thereto as well as one or more bits contained in said known data that were written to said one or more reference cells;

obtaining said at least one soft data value based on said obtained read statistic; and applying said at least one soft data value to said soft decoding of said data.

2. The method of claim 1, wherein said soft data value comprises a soft read value that is used to generate one or more log likelihood ratios.

3. The method of claim 1, wherein said soft data value comprises one or more log likelihood ratios.

4. The method of claim 1, wherein said read statistic is determined by comparing one or more bits read from said one or more reference cells having the known data written thereto to one or more bits in said known data.

5. The method of claim 1, wherein said known data comprises one or more of a bit pattern and a symbol pattern written to a plurality of predetermined reference cells.

6. The method of claim 1, wherein said read statistic is based on a number of erroneous bits relative to a total number of reference bits in said known data.

7. The method of claim 1, wherein one or more of said read statistic and said soft data value are obtained from a table.

8. The method of claim 1, wherein one or more of said read statistic and said soft data value are computed as a function of one or more of endurance, number of program/erase cycles, number of read cycles, retention time, temperature, temperature changes, process corner, inter-cell interference impact, location within said memory device, location within a word-line, location within a memory array, and pattern in aggressor cells.

9. The method of claim 1, wherein said read statistic is obtained for one or more desired locations of a memory array and wherein said writing step comprises writing said known data to said one or more desired locations.

10. The method of claim 9, wherein said desired locations comprise one or more of a page location, a wordline location, a bitline location and a given bit within a multi-level cell.

11. The method of claim 10, wherein said given bit within a multi-level cell comprises one or more of a most significant bit (MSB) and a least significant bit (LSB).

12. The method of claim 10, wherein said known data is written to desired locations corresponding to one or more of said bits within a multi-level cell.

13. The method of claim 9, wherein said read statistic is based on a number of erroneous bits in said one or more desired locations relative to a total number of considered bits.

14. The method of claim 9, wherein said read statistic for one or more desired locations is employed to decode data associated with said one or more desired locations.

15. The method of claim 1, wherein said read statistic is obtained for a given pattern, PATT, in one or more aggressor cells associated with at least one target cell; and wherein said writing step comprises writing said known data to said at least one target cell; and wherein said method further comprises the steps of determining a number of erroneous target bits having said given pattern, PATT, in said one or more aggressor cells; and obtaining said read statistic for said given pattern based on said number of erroneous target bits.

16. The method of claim 15, further comprising the step of reading said one or more aggressor cells to determine said pattern, PATT.

17. The method of claim 15, further comprising the step of writing a known pattern to said one or more aggressor cells.

18. The method of claim 15, wherein said read statistic is based on a number of erroneous target bits relative to a total number of target bits.

19. The method of claim 15, wherein said read statistic for said given pattern, PATT, is employed to decode data when said one or more associated aggressor cells comprise said pattern, PATT.

20. The method of claim 1, wherein said read statistic comprises asymmetric read statistics obtained for a plurality of possible values; and wherein said method further comprises the steps of determining a number of erroneous bits having a first value in said known data; determining said number of erroneous bits having a second value in said known data; obtaining a read statistic for said first value based on said number of erroneous bits having said first value; and obtaining a read statistic for said second value based on said number of erroneous bits having said second value.

21. The method of claim 20, wherein said read statistics are based on said number of erroneous bits having a respective value relative to a total number of reference bits having said respective value.

22. The method of claim 20, wherein said asymmetric read statistics are employed to decode data having one or more respective values.

23. The method of claim 1, wherein said soft data value is iteratively provided to said decoder.

24. The method of claim 1, wherein said reference cells store substantially all possible levels.

25. The method of claim 1, wherein said reference cells have a periodic pattern.

26. The method of claim 1, wherein said reference cells are periodically written or read over time.

27. A system for generating at least one soft data value in a memory device, comprising:
a memory; and
at least one processor, coupled to the memory, operative to:
write known data to one or more reference cells in said memory device, wherein said memory device comprises a plurality of cells and wherein at least a portion of said plurality of cells are used as said reference cells;
read one or more of said reference cells at least some of which have said known data written thereto;
determine a read statistic for generating said at least one soft data value for soft decoding of data, wherein said read statistic is based on said read one or more reference cells, wherein said read statistic is determined based on one or more bits read from said one or more reference cells having said known data written thereto as well as one or more bits obtained from said known data that were written to said one or more reference cells; and
determine said at least one soft data value based on said determined read statistic; and
apply said at least one soft data value to said soft decoding of said data.

28. The system of claim 27, wherein said read statistic is determined by comparing one or more bits read from said one or more reference cells having the known data written thereto to one or more bits in said known data.

29. The system of claim 27, wherein said known data comprises one or more of a bit pattern and a symbol pattern written to a plurality of predetermined reference cells.

30. The system of claim 27, wherein said read statistic is based on a number of erroneous bits relative to a total number of reference bits in said known data.

31. The system of claim 27, wherein one or more of said read statistic and said soft data value are computed as a function of one or more of endurance, number of program/erase cycles, number of read cycles, retention time, temperature, temperature changes, process corner, inter-cell interference impact, location within said memory device, location within a wordline, location within a memory array, and pattern in aggressor cells.

32. The system of claim 27, wherein said read statistic is obtained for one or more desired locations of a memory array and wherein said known data is written by writing said known data to said one or more desired locations.

33. The system of claim 32, wherein said read statistic is based on a number of erroneous bits in said one or more desired locations relative to a total number of considered bits.

34. The system of claim 32, wherein said read statistic for one or more desired locations is employed to decode data associated with said one or more desired locations.

35. The system of claim 27, wherein said read statistic is obtained for a given pattern, PATT, in one or more aggressor cells associated with at least one target cell; and wherein said known data is written by writing said known data to said at least one target cell; and wherein said at least one processor is further configured to determine a number of erroneous target bits having said given pattern, PATT in said one or more aggressor cells; and obtain said read statistic for said given pattern based on said number of erroneous target bits.

36. The system of claim 35, wherein said read statistic is based on a number of erroneous target bits relative to a total number of target bits.

37. The system of claim 35, wherein said read statistic for said given pattern, PATT, is employed to decode data when said one or more associated aggressor cells comprise said pattern, PATT.

* * * * *